United States Patent
Takenaka

(10) Patent No.: US 12,057,878 B2
(45) Date of Patent: Aug. 6, 2024

(54) RADIO-FREQUENCY CIRCUIT AND COMMUNICATION DEVICE

(71) Applicant: Murata Manufacturing Co., Ltd., Kyoto (JP)

(72) Inventor: Isao Takenaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 366 days.

(21) Appl. No.: 17/651,491

(22) Filed: Feb. 17, 2022

(65) Prior Publication Data

US 2022/0173765 A1    Jun. 2, 2022

Related U.S. Application Data

(63) Continuation of application No. PCT/JP2020/024505, filed on Jun. 23, 2020.

(30) Foreign Application Priority Data

Aug. 26, 2019 (JP) .................... 2019-154164

(51) Int. Cl.
   *H04B 1/44*    (2006.01)
   *H03F 3/24*    (2006.01)
   *H04B 1/525*   (2015.01)

(52) U.S. Cl.
   CPC ............. *H04B 1/525* (2013.01); *H03F 3/245* (2013.01); *H03F 2200/165* (2013.01); *H03F 2200/294* (2013.01); *H03F 2200/451* (2013.01)

(58) Field of Classification Search
   CPC .... H04B 1/44; H04B 1/50; H03F 3/62; H03F 3/213; H03H 7/38; H03H 11/28;
   (Continued)

(56) References Cited

U.S. PATENT DOCUMENTS

| | | |
|---|---|---|
| 2017/0005527 A1 | 1/2017 | Ishihara |
| 2017/0194940 A1 | 7/2017 | Nurikabe et al. |

(Continued)

FOREIGN PATENT DOCUMENTS

| | | |
|---|---|---|
| WO | 2015/156079 A1 | 10/2015 |
| WO | 2015/189998 A1 | 12/2015 |

OTHER PUBLICATIONS

International Search Report for International Application No. PCT/JP2020/024505 dated Sep. 29, 2020.

(Continued)

*Primary Examiner* — Tu X Nguyen
(74) *Attorney, Agent, or Firm* — Pearne & Gordon LLP

(57) ABSTRACT

Desired characteristics can be achieved. A radio-frequency circuit includes an inductor and a switch. The inductor has a first end and a second end. The switch has a first input-output terminal, a second input-output terminal, a first switching terminal coupled to the first end of the inductor, and a second switching terminal coupled to the second end of the inductor. The switch can switch between a first state and a second state. In the first state, the first input-output terminal is coupled to the first switching terminal, and the second input-output terminal is coupled to the second switching terminal. In the second state, the first input-output terminal is coupled to the second switching terminal, and the second input-output terminal is coupled to the first switching terminal.

8 Claims, 9 Drawing Sheets

(58) Field of Classification Search
CPC ........... H03H 9/46; H01F 38/14; H01F 27/28; H01F 5/00; H02J 50/10; H04Q 3/00
See application file for complete search history.

(56) References Cited

U.S. PATENT DOCUMENTS

2019/0103843 A1    4/2019   Aikawa
2020/0274575 A1*   8/2020   Yang ........................ H04L 5/16

OTHER PUBLICATIONS

Written Opinion for International Application No. PCT/JP2020/024505 dated Sep. 29, 2020.

* cited by examiner

RADIO-FREQUENCY CIRCUIT AND COMMUNICATION DEVICE

CROSS REFERENCE TO RELATED APPLICATIONS

This is a continuation of International Application No. PCT/JP2020/024505 filed on Jun. 23, 2020, which claims priority from Japanese Patent Application No. 2019-154164 filed on Aug. 26, 2019. The contents of these applications are incorporated herein by reference in their entireties.

BACKGROUND ART

Technical Field

The present disclosure generally relates to radio-frequency circuits and communication devices and more particularly relates to a radio-frequency circuit including an inductor and a communication device including the radio-frequency circuit.

Heretofore, radio-frequency circuits supporting a plurality of frequency bands have been known (refer to, for example, Patent Document 1). The radio-frequency circuit described in Patent Document 1 includes an input-side impedance matching circuit and an output-side impedance matching circuit. The input-side impedance matching circuit includes a first inductor mounted on a mounting board. The output-side impedance matching circuit includes a second inductor mounted on the mounting board.

Patent Document 1: Japanese Unexamined Patent Application Publication No. 2019-68205

BRIEF SUMMARY

The possibility exists that the radio-frequency circuit described in Patent Document 1 cannot achieve desired characteristics when the first inductor and the second inductor are arranged in a particular manner on the mounting board and accordingly coupled to each other.

The present disclosure provides a radio-frequency circuit and a communication device that can achieve desired characteristics.

A radio-frequency circuit according to an aspect of the present disclosure includes an inductor and a switch. The inductor has a first end and a second end. The switch has a first input-output terminal, a second input-output terminal, a first switching terminal coupled to the first end of the inductor, and a second switching terminal coupled to the second end of the inductor. The switch can switch between a first state and a second state. In the first state, the first input-output terminal is coupled to the first switching terminal, and the second input-output terminal is coupled to the second switching terminal. In the second state, the first input-output terminal is coupled to the second switching terminal, and the second input-output terminal is coupled to the first switching terminal.

A communication device according to an aspect of the present disclosure includes the radio-frequency circuit and a signal processing circuit. The signal processing circuit processes at least one of a receive signal transferred from an antenna terminal and a transmit signal to be transferred to the antenna terminal.

The radio-frequency circuit according to the aspect of the present disclosure and the communication device according to the aspect of the present disclosure can achieve desired characteristics.

DETAILED DESCRIPTION

Figure 1:
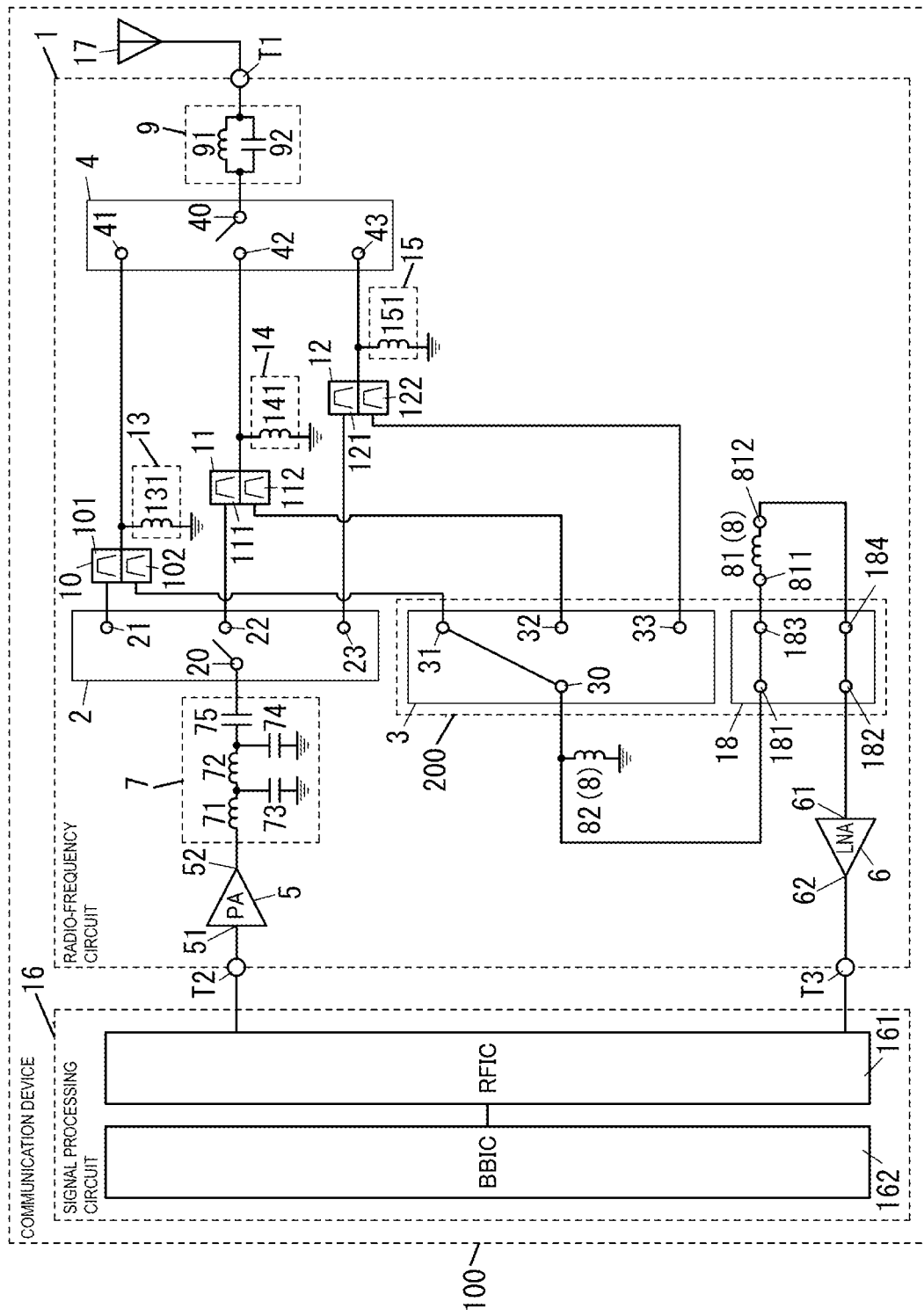
FIG. 1 is a circuit configuration diagram of a communication device including a radio-frequency circuit according to a first embodiment.

Hereinafter, radio-frequency circuits and communication devices according to first to third embodiments will be described with reference to the drawings.

First Embodiment

(1) CONFIGURATION OF RADIO-FREQUENCY CIRCUIT

Firstly, a configuration of a radio-frequency circuit 1 according to the first embodiment will be described with reference to FIG. 1.

The radio-frequency circuit 1 according to the first embodiment is used in, for example, a communication device 100. The communication device 100 is, for example, a mobile phone such as a smartphone. The communication device 100 is not limited to a mobile phone but may be, for example, a wearable terminal such as a smartwatch. The radio-frequency circuit 1 supports, for example, carrier aggregation and dual connectivity.

The radio-frequency circuit 1 is provided in the communication device 100 that, for example, supports multiple bands in compliance with a communication standard such as Long Term Evolution (LTE). The radio-frequency circuit 1 can provide, for example, bidirectional transfer of full duplex communication by allocating different frequencies to transmit signals (transmitting radio-frequency signals) and receive signals (received radio-frequency signals) in accordance with frequency division duplex (FDD).

The radio-frequency circuit 1 can be electrically coupled to an external substrate (not illustrated in the drawing). The external substrate is, for example, a mother substrate of a mobile phone or communication device. Here, the condition that the radio-frequency circuit 1 can be electrically coupled to the external substrate includes, in addition to the case in which the radio-frequency circuit 1 is directly mounted on the external substrate, the case in which the radio-frequency circuit 1 is indirectly mounted on the external substrate. The case in which the radio-frequency circuit 1 is indirectly mounted on the external substrate includes, for example, the case in which the radio-frequency circuit 1 is mounted on another radio-frequency circuit mounted on the external substrate.

The radio-frequency circuit 1 according to the present embodiment includes an inductor 81 and a switch 18.

The inductor 81 has a first end 811 and a second end 812. The switch 18 has a terminal 181 serving as a first input-output terminal, a terminal 182 as a second input-output terminal, a terminal 183 as a first switching terminal, and a terminal 184 as a second switching terminal. The terminal 183 is coupled to the first end 811 of the inductor 81. The terminal 184 is coupled to the second end 812 of the inductor 81. The terminal 181 serving as the first input-output terminal is, for example, an input terminal. The terminal 182 serving as the second input-output terminal is, for example, an output terminal.

The switch 18 can switch between a first state and a second state. In the first state, the terminal 181 is coupled to the terminal 183, and the terminal 182 is coupled to the terminal 184 (refer to FIG. 2A). In the second state, the terminal 181 is coupled to the terminal 184, and the terminal 182 is coupled to the terminal 183 (refer to FIG. 2B).

The radio-frequency circuit 1 according to the first embodiment further includes switches 2, 3, and 4. The switch 2 has a common terminal 20 and a plurality (three in FIG. 1) of selection terminals of selection terminals 21, 22, and 23. The switch 3 has a common terminal 30 and a plurality (three in FIG. 1) of selection terminals of selection terminals 31, 32, and 33. The switch 4 has a common terminal 40 and a plurality (three in FIG. 1) of selection terminals of selection terminals 41, 42, and 43. In the radio-frequency circuit 1 according to the first embodiment, the switches 3 and 18 are formed by a single chip component 200.

The radio-frequency circuit 1 according to the first embodiment further includes a power amplifier 5, a low-noise amplifier 6, and a low pass filter 9. The power amplifier 5 amplifies a transmit signal to be transferred to an antenna terminal T1. The low-noise amplifier 6 amplifies a receive signal transferred from the antenna terminal T1. The low pass filter 9 is electrically coupled to the antenna terminal T1.

The radio-frequency circuit 1 according to the first embodiment further includes a plurality (three in FIG. 1) of duplexers of duplexers 10, 11, and 12. The duplexer 10 includes a transmit filter 101 and a receive filter 102. The duplexer 11 includes a transmit filter 111 and a receive filter 112. The duplexer 12 includes a transmit filter 121 and a receive filter 122.

The radio-frequency circuit 1 according to the first embodiment further includes an output matching circuit 7, an input matching circuit 8, a plurality (three in FIG. 1) of matching circuits of matching circuits 13, 14, and 15. The matching circuits 13, 14, and 15 and the duplexers 10, 11, and 12 are provided in one-to-one correspondence. The output matching circuit 7 is disposed in a signal path between an output terminal 52 of the power amplifier 5 and the common terminal 20 of the switch 2. The input matching circuit 8 is disposed in a signal path between the common terminal 30 of the switch 3 and an input terminal 61 of the low-noise amplifier 6. The matching circuit 13 is disposed in a signal path between the duplexer 10 and the selection terminal 41 of the switch 4. The matching circuit 14 is disposed in a signal path between the duplexer 11 and the selection terminal 42 of the switch 4. The matching circuit 15 is disposed in a signal path between the duplexer 12 and the selection terminal 43 of the switch 4.

The radio-frequency circuit 1 according to the first embodiment further includes the antenna terminal T1, a signal input terminal T2, and a signal output terminal T3. The signal input terminal T2 is coupled to an input terminal 51 of the power amplifier 5. The signal output terminal T3 is coupled to an output terminal 62 of the low-noise amplifier 6. The antenna terminal T1 is coupled to the low pass filter 9.

(2) CONSTITUENT ELEMENTS OF RADIO-FREQUENCY CIRCUIT

Next, constituent elements of the radio-frequency circuit 1 according to the first embodiment will be described with reference to FIG. 1.

(2.1) Duplexer

The duplexer 10 includes the transmit filter 101 and the receive filter 102.

The transmit filter 101 is a transmit filter supporting a first communication band and configured to pass a first transmit signal. The transmit filter 101 has an input terminal and an output terminal. The input terminal of the transmit filter 101 is coupled to the selection terminal 21 of the switch 2. The output terminal of the transmit filter 101 is coupled to the selection terminal 41 of the switch 4.

The receive filter 102 is a receive filter supporting the first communication band and configured to pass a first receive signal. The receive filter 102 has an input terminal and an output terminal. The input terminal of the receive filter 102 is coupled to the selection terminal 41 of the switch 4. The output terminal of the receive filter 102 is coupled to the terminal (first input-output terminal) 31 of the switch 3.

In the radio-frequency circuit 1, the output terminal of the transmit filter 101 and the input terminal of the receive filter 102 are both coupled to the selection terminal 41 of the switch 4. This means that in the radio-frequency circuit 1 the output terminal of the transmit filter 101 and the input terminal of the receive filter 102 are bound together.

The duplexer 11 includes the transmit filter 111 and the receive filter 112.

The transmit filter 111 is a transmit filter supporting a second communication band and configured to pass a second transmit signal. The transmit filter 111 has an input terminal and an output terminal. The input terminal of the transmit filter 111 is coupled to the selection terminal 22 of the switch 2. The output terminal of the transmit filter 111 is coupled to the selection terminal 42 of the switch 4.

The receive filter 112 is a receive filter supporting the second communication band and configured to pass a second receive signal. The receive filter 112 has an input terminal and an output terminal. The input terminal of the receive filter 112 is coupled to the selection terminal 42 of the switch 4. The output terminal of the receive filter 112 is coupled to the terminal (first input-output terminal) 32 of the switch 3.

In the radio-frequency circuit 1, the output terminal of the transmit filter 111 and the input terminal of the receive filter 112 are both coupled to the selection terminal 42 of the switch 4. This means that in the radio-frequency circuit 1 the output terminal of the transmit filter 111 and the input terminal of the receive filter 112 are bound together.

The duplexer 12 includes the transmit filter 121 and the receive filter 122.

The transmit filter 121 is a transmit filter supporting a third communication band and configured to pass a third transmit signal. The transmit filter 121 has an input terminal and an output terminal. The input terminal of the transmit filter 121 is coupled to the selection terminal 23 of the switch 2. The output terminal of the transmit filter 121 is coupled to the selection terminal 43 of the switch 4.

The receive filter 122 is a receive filter supporting the third communication band and configured to pass a third receive signal. The receive filter 122 has an input terminal and an output terminal. The input terminal of the receive filter 122 is coupled to the selection terminal 43 of the switch 4. The output terminal of the receive filter 122 is coupled to the terminal (first input-output terminal) 33 of the switch 3.

In the radio-frequency circuit 1, the output terminal of the transmit filter 121 and the input terminal of the receive filter 122 are both coupled to the selection terminal 43 of the switch 4. This means that in the radio-frequency circuit 1 the output terminal of the transmit filter 121 and the input terminal of the receive filter 122 are bound together.

The first communication band, which is the pass band of the transmit filter 101 and the receive filter 102, is, for example, Band 8. The second communication band, which is the pass band of the transmit filter 111 and the receive filter 112, is, for example, Band 20. The third communication band, which is the pass band of the transmit filter 121 and the receive filter 122, is, for example, Band 13.

(2.2) Power Amplifier

The power amplifier 5 is an amplifier configured to amplify the first, second, and third transmit signals. The power amplifier 5 is disposed in a transmit path coupling the antenna terminal T1 and the signal input terminal T2. More specifically, the power amplifier 5 is provided between the output matching circuit 7 and the signal input terminal T2. The power amplifier 5 has the input terminal 51 and the output terminal 52. The input terminal 51 is coupled to an external circuit (for example, a signal processing circuit 16) via the signal input terminal T2. The signal input terminal T2 is a terminal for inputting radio-frequency signals (first, second, and third transmit signals) from the external circuit to the radio-frequency circuit 1. The output terminal 52 is coupled to an input end of the output matching circuit 7 (a first end of an inductor 71).

The power amplifier 5 is controlled by, for example, a radio-frequency (RF) signal processing circuit 161 of the signal processing circuit 16 described later, but the power amplifier 5 may be controlled by a power amplifier controller (not illustrated in the drawing).

(2.3) Low-Noise Amplifier

The low-noise amplifier 6 is an amplifier configured to amplify with low noise the first, second, and third receive signals. The low-noise amplifier 6 is disposed in a receive path coupling the antenna terminal T1 and the signal output terminal T3. More specifically, the low-noise amplifier 6 is disposed between the switch 3 and the signal output terminal T3. The low-noise amplifier 6 has the input terminal 61 and the output terminal 62. The input terminal 61 is coupled to the terminal (second input-output terminal) 36 of the switch 3. The output terminal 62 is coupled to an external circuit (for example, the signal processing circuit 16) via the signal output terminal T3. The signal output terminal T3 is a terminal for outputting radio-frequency signals from the radio-frequency circuit 1 to the external circuit.

The low-noise amplifier 6 is controlled by, for example, the RF signal processing circuit 161 of the signal processing circuit 16.

(2.4) Switch

The switch 2 has the common terminal 20 and a plurality (three in FIG. 1) of selection terminals of the selection terminals 21, 22, and 23. The switch 2 switches connections between the common terminal 20 and the selection terminals 21, 22, and 23. More specifically, the switch 2 switches among the state in which the common terminal 20 is coupled to the selection terminal 21, the state in which the common terminal 20 is coupled to the selection terminal 22, and the state in which the common terminal 20 is coupled to the selection terminal 23. The switch 2 may be implemented by, for example, a single pole triple throw (SP3T) switch.

The switch 3 has the common terminal 30 and a plurality (three in FIG. 1) of selection terminals of the selection terminals 31, 32, and 33. The switch 3 switches connections between the common terminal 30 and the selection terminals 31, 32, and 33. More specifically, the switch 3 switches among the state in which the common terminal 30 is coupled to the selection terminal 31, the state in which the common terminal 30 is coupled to the selection terminal 32, and the state in which the common terminal 30 is coupled to the selection terminal 32. The switch 3 may be implemented by, for example, an SP3T switch.

The switch 18 has the terminal 181 serving as the first input-output terminal, the terminal 182 as the second input-output terminal, the terminal 183 as the first switching terminal, and the terminal 184 as the second switching terminal. The terminal 181 serving as the first input-output terminal is, for example, an input terminal. The terminal 182 serving as the second input-output terminal is, for example, an output terminal. The switch 18 switches connections between the terminals 181 and 182 and the terminals 183 and 184. The switch 18 may be implemented by, for example, a dual pole dual throw (DPDT) switch.

The switch 18 can switch between the first state and the second state to reverse the direction of current flow in the inductor 81. In the first state, the terminal 181 as the first input-output terminal is coupled to the terminal 183 as the first switching terminal, and the terminal 182 as the second input-output terminal is coupled to the terminal 184 as the second switching terminal (refer to FIGS. 2A and 3A). In the second state, the terminal 181 as the first input-output terminal is coupled to the terminal 184 as the second switching terminal, and the terminal 182 as the second input-output terminal is coupled to the terminal 183 as the first switching terminal (refer to FIGS. 2B and 3B).

In the radio-frequency circuit 1 according to the first embodiment, the single chip component 200 implements both the switch 3 for switching signal paths for receive signals in different communication bands and the switch 18 for changing the direction of current flow in the inductor 81; in other words, the switch 18 for changing the direction of current flow in the inductor 81 is integrated with the switch 3 for switching signal paths for receive signals in different communication bands. The term "integrated" means that the two switches 3 and 18 are physically integrated with each other.

The switch 4 has the common terminal 40 and a plurality (three in FIG. 1) of selection terminals of the selection terminals 41, 42, and 43. The switch 4 switches connections between the common terminal 40 and the selection terminals 41, 42, and 43. More specifically, the switch 4 switches among the state in which the common terminal 40 is coupled to the selection terminal 41, the state in which the common terminal 40 is coupled to the selection terminal 42, and the state in which the common terminal 40 is coupled to the selection terminal 43. The switch 4 may be implemented by, for example, an SP3T switch.

The switches 2, 3, 4, and 18 are controlled by, for example, the RF signal processing circuit 161 of the signal processing circuit 16, but the switches 2, 3, 4, and 18 may be controlled by a power amplifier controller (not illustrated in the drawing).

(2.5) Output Matching Circuit

The output matching circuit 7 is disposed in the signal path between the output terminal 52 of the power amplifier 5 and the common terminal 20 of the switch 2. The output matching circuit 7 is a circuit for providing impedance matching between the power amplifier 5 and the transmit filters 101, 111, and 121 coupled respectively to the selection terminals 21, 22, and 23 of the switch 2. The output matching circuit 7 includes a plurality (two in FIG. 1) of inductors of the inductor 71 and an inductor 72 and a plurality (three in FIG. 1) of capacitors of capacitors 73, 74, and 75.

The first end of the inductor 71 is coupled to the output terminal 52 of the power amplifier 5, and a second end of the inductor 71 is coupled to a first end of the inductor 72. A second end of the inductor 72 is coupled to a first end of the capacitor 75, and a second end of the capacitor 75 is coupled to the common terminal 20 of the switch 2. This means that in the radio-frequency circuit 1 according to the first embodiment the inductors 71 and 72 and the capacitor 75 are coupled in series with each other between the output terminal 52 of the power amplifier 5 and the common terminal 20 of the switch 2.

The capacitor 73 is coupled between a node of the inductors 71 and 72 and the ground. The capacitor 74 is coupled to a node of the inductor 72 and the capacitor 75 and the ground.

(2.6) Input Matching Circuit

The input matching circuit 8 is disposed in the signal path between the common terminal 30 of the switch 3 and the input terminal 61 of the low-noise amplifier 6. The input matching circuit 8 is a circuit for providing impedance matching between the low-noise amplifier 6 and the receive filters 102, 112, and 122 coupled respectively to the terminals 31, 32, and 33 of the switch 3. The input matching circuit 8 includes a plurality (two in FIG. 1) of inductors of the inductor 81 and an inductor 82.

The inductor 81 has the first end 811 and the second end 812. The first end 811 of the inductor 81 is coupled to the terminal 183 (first switching terminal) of the switch 18. The second end 812 of the inductor 81 is coupled to the terminal 184 (second switching terminal) of the switch 18. The inductor 82 is coupled between the ground and a signal path between the common terminal 30 of the switch 3 and the terminal 181 of the switch 18.

(2.7) Matching Circuit

The matching circuit 13 is disposed in a signal path between the duplexer 10 and the switch 4. The matching circuit 13 is a circuit for providing impedance matching between an antenna 17 coupled to the antenna terminal T1 and the duplexer 10. The matching circuit 13 includes an inductor 131. The inductor 131 is coupled between the ground and the signal path between the duplexer 10 and the switch 4.

The matching circuit 14 is disposed in a signal path between the duplexer 11 and the switch 4. The matching circuit 14 is a circuit for providing impedance matching between the antenna 17 coupled to the antenna terminal T1 and the duplexer 11. The matching circuit 14 includes an inductor 141. The inductor 141 is coupled between the ground and the signal path between the duplexer 11 and the switch 4.

The matching circuit 15 is disposed in a signal path between the duplexer 12 and the switch 4. The matching circuit 15 is a circuit for providing impedance matching between the antenna 17 coupled to the antenna terminal T1 and the duplexer 12. The matching circuit 15 includes an inductor 151. The inductor 151 is coupled between the ground and the signal path between the duplexer 12 and the switch 4.

(2.8) Low Pass Filter

The low pass filter 9 is disposed in a signal path between the switch 4 and the antenna terminal T1. The low pass filter 9 includes an inductor 91 and a capacitor 92.

The inductor 91 is coupled between the common terminal 40 of the switch 4 and the antenna terminal T1; in other words, a first end of the inductor 91 is coupled to the common terminal 40 of the switch 4, and a second end of the inductor 91 is coupled to the antenna terminal T1.

The capacitor 92 is coupled between the common terminal 40 of the switch 4 and the antenna terminal T1; in other words, a first end of the capacitor 92 is coupled to the common terminal 40 of the switch 4, and a second end of the capacitor 92 is coupled to the antenna terminal T1.

This means that in the radio-frequency circuit 1 according to the first embodiment the inductor 91 and the capacitor 92 are coupled in parallel with each other between the common terminal 40 of the switch 4 and the antenna terminal T1.

(3) CONFIGURATION OF COMMUNICATION DEVICE

Next, a configuration of the communication device 100 according to the first embodiment will be described with reference to FIG. 1.

As illustrated in FIG. 1, the communication device 100 includes the radio-frequency circuit 1, the signal processing circuit 16, and the antenna 17.

The antenna 17 is coupled to the antenna terminal T1 of the radio-frequency circuit 1. The antenna 17 has a functionality of transmitting by emission as a radio wave at least one of the first, second, and third transmit signals outputted by the radio-frequency circuit 1. The antenna 17 also has a functionality of receiving as a radio wave at least one of the first, second, and third receive signals and outputting the signal to the radio-frequency circuit 1.

The signal processing circuit 16 includes the RF signal processing circuit 161 and a baseband signal processing circuit 162. The signal processing circuit 16 processes the first, second, and third transmit signals and the first, second, and third receive signals.

The RF signal processing circuit 161 is, for example, a radio frequency integrated circuit (RFIC) and processes radio-frequency signals. The RF signal processing circuit 161 processes by, for example, upconversion a radio-frequency signal outputted by the baseband signal processing circuit 162 and outputs the processed radio-frequency signal to the radio-frequency circuit 1.

Specifically, the RF signal processing circuit 161 processes by, for example, upconversion the first transmit signal outputted by the baseband signal processing circuit 162 and outputs the processed first transmit signal to a first transmit path in the radio-frequency circuit 1. The first transmit path is a path routed through the transmit filter 101 of the duplexer 10 out of the transmit paths coupling the antenna terminal T1 and the signal input terminal T2.

The RF signal processing circuit 161 also processes by, for example, upconversion the second transmit signal outputted by the baseband signal processing circuit 162 and outputs the processed second transmit signal to a second transmit path in the radio-frequency circuit 1. The second transmit path is a path routed through the transmit filter 111 of the duplexer 11 out of the transmit paths coupling the antenna terminal T1 and the signal input terminal T2.

The RF signal processing circuit 161 also processes by, for example, upconversion the third transmit signal outputted by the baseband signal processing circuit 162 and outputs the processed third transmit signal to a third transmit path in the radio-frequency circuit 1. The third transmit path is a path routed through the transmit filter 121 of the duplexer 12 out of the transmit paths coupling the antenna terminal T1 and the signal input terminal T2.

The RF signal processing circuit 161 also processes by, for example, downconversion a radio-frequency signal outputted by the radio-frequency circuit 1 and outputs the processed radio-frequency signal to the baseband signal processing circuit 162.

Specifically, the RF signal processing circuit 161 processes the first receive signal outputted from a first receive path in the radio-frequency circuit 1 and outputs the processed first receive signal to the baseband signal processing circuit 162. The first receive path is a path routed through the receive filter 102 of the duplexer 10 out of the receive paths coupling the antenna terminal T1 and the signal output terminal T3.

The RF signal processing circuit 161 also processes the second receive signal outputted from a second receive path in the radio-frequency circuit 1 and outputs the processed second receive signal to the baseband signal processing circuit 162. The second receive path is a path routed through the receive filter 112 of the duplexer 11 out of the receive paths coupling the antenna terminal T1 and the signal output terminal T3.

The RF signal processing circuit 161 also processes the third receive signal outputted from a third receive path in the radio-frequency circuit 1 and outputs the processed third receive signal to the baseband signal processing circuit 162. The third receive path is a path routed through the receive filter 122 of the duplexer 12 out of the receive paths coupling the antenna terminal T1 and the signal output terminal T3.

The baseband signal processing circuit 162 is, for example, a baseband integrated circuit (BBIC). The baseband signal processing circuit 162 processes in a predetermined manner transmit signals from outside of the signal processing circuit 16. The receive signal processed by the baseband signal processing circuit 162 is used as, for example, an image signal for displaying an image or a sound signal for phone calls.

The RF signal processing circuit 161 also functions as a controller for controlling the switches 2, 3, and 4, the power amplifier 5, and the low-noise amplifier 6 included in the radio-frequency circuit 1 in accordance with the communication band (frequency band) in use. Specifically, the RF signal processing circuit 161 uses a control signal to control the switches 2, 3, and 4, the power amplifier 5, and the low-noise amplifier 6. The controller may be provided outside the RF signal processing circuit 161; for example, the controller may be provided in the radio-frequency circuit 1 or the baseband signal processing circuit 162.

(4) OPERATION OF RADIO-FREQUENCY CIRCUIT (4.1) First Operation

Next, a first operation of the radio-frequency circuit 1 according to the first embodiment will be described with reference to FIGS. 2A and 2B.

In the radio-frequency circuit 1 according to the first embodiment, for example, the input matching circuit 8 includes the inductor 81 mounted at a mounting board (not illustrated in the drawing). In the radio-frequency circuit 1, for example, the matching circuit 13 includes the inductor 131 mounted at the mounting board. Depending on at least either the position or orientation of the inductor 81 of the input matching circuit 8 relative to the inductor 131 of the matching circuit 13, the inductors 81 and 131 may cause magnetic coupling. This may worsen the isolation between the transmit and receive paths particularly in the transmit frequency band, and as a result, transmit signals may leak into the receive path, resulting in deterioration of receive sensitivity.

To address the problem described above, the radio-frequency circuit 1 according to the first embodiment is configured in the following manner. The following description uses an example of the magnetic coupling between the inductor 81 of the input matching circuit 8 and the inductor 131 of the matching circuit 13, but the same description holds for the magnetic coupling between the inductor 81 of the input matching circuit 8 and the inductor 141 of the matching circuit 14 and the magnetic coupling between the inductor 81 of the input matching circuit 8 and the inductor 151 of the matching circuit 15. Also, the following description uses as an example the case in which the common terminal 30 of the switch 3 is coupled to the selection terminal 31, but the same description holds for the case in which the common terminal 30 is coupled to the selection terminal 32 or the selection terminal 33.

In the radio-frequency circuit 1 according to the first embodiment, the inductor in which the direction of current flow is changed in accordance with the connection state of the switch is the inductor 81 coupled to the input side of the low-noise amplifier 6. In the radio-frequency circuit 1 according to the first embodiment, the inductors that may cause magnetic coupling with the inductor described above are the inductor 131 of the matching circuit 13, the inductor 141 of the matching circuit 14, and the inductor 151 of the matching circuit 15.

Figure 2A:
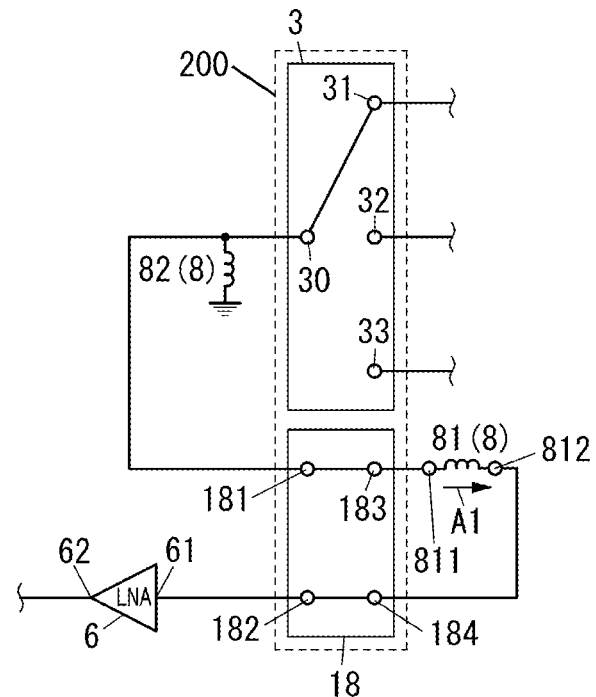
FIG. 2A illustrates connections of switches in a first state in the radio-frequency circuit.
Figure 2B:
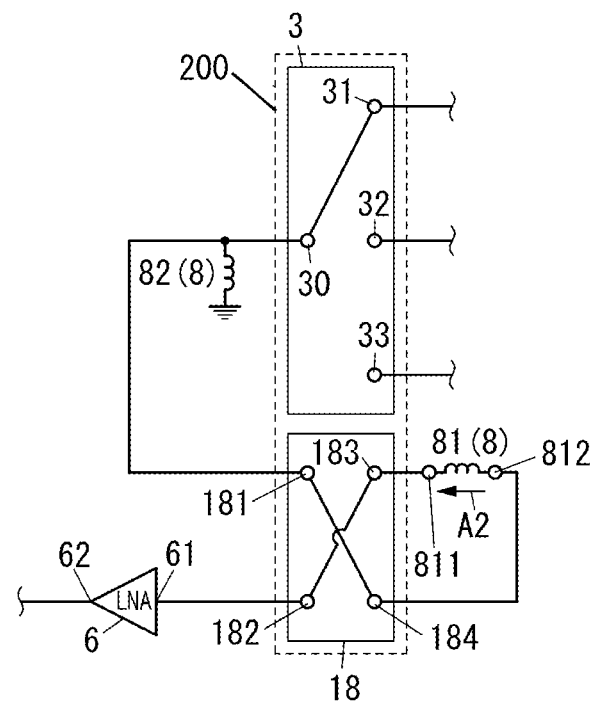
FIG. 2B illustrates connections of the switches in a second state in the radio-frequency circuit.

In FIG. 2A, the switch 18 is in the first state. When the switch 18 is in the first state, the terminal 181 as the first input-output terminal is coupled to the terminal 183 as the first switching terminal, and the terminal 182 as the second input-output terminal is coupled to the terminal 184 as the second switching terminal. In this case, a current flows through the inductor 81 of the input matching circuit 8 in the direction indicated by an arrow A1. Accordingly, a magnetic field is generated around the inductor 81 in the direction corresponding to the current. At this time, a current also flows through the inductor 131 of the matching circuit 13, and a magnetic field is generated around the inductor 131 in the direction corresponding to the current.

When the direction of the magnetic field generated around the inductor 81 is identical to the direction of the magnetic field generated around the inductor 131, the magnetic field generated around the inductor 81 and the magnetic field generated around the inductor 131 strengthen each other, and consequently, the inductors 81 and 131 cause magnetic coupling. This worsens the isolation between the transmit and receive paths particularly in the transmit frequency band, and as a result, transmit signals leak into the receive path, resulting in degradation of receive sensitivity In this case, the direction of current flow in the inductor 81 can be reversed by switching the switch 18 to the second state as illustrated in FIG. 2B. Specifically, in the switch 18, the terminal 181 as the first input-output terminal is coupled to the terminal 184 as the second switching terminal, and the terminal 182 as the second input-output terminal is coupled to the terminal 183 as the first switching terminal. In this state, a current flows through the inductor 81 of the input matching circuit 8 in the direction indicated by an arrow A2 opposite to the arrow A1. Accordingly, a magnetic field is generated around the inductor 81 in the direction corresponding to the current.

In this case, the direction of the magnetic field generated around the inductor 81 is opposite to the direction of the magnetic field generated around the inductor 131, and the magnetic field generated around the inductor 81 and the magnetic field generated around the inductor 131 cancel each other out. As such, it is possible to hinder the magnetic coupling between the inductors 81 and 131. This can suppress degradation of the isolation between the transmit and receive paths particularly in the transmit frequency band, and as a result, it is possible to suppress degradation of receive sensitivity during the transmit operation.

Similarly, by switching the switch 18 between the first state and the second state, it is possible to hinder the magnetic coupling between the inductor 81 of the input matching circuit 8 and the inductor 72 of the output matching circuit 7 and the magnetic coupling between the inductor 81 of the input matching circuit 8 and the inductor 91 of the low pass filter 9. In this case, the inductor in which the direction of current flow is changed by the switch is the inductor 81 of the input matching circuit 8, and the inductors that may cause magnetic coupling with this inductor are the inductor 72 of the output matching circuit 7 and the inductor 91 of the low pass filter 9.

(4.2) Second Operation

Next, a second operation of the radio-frequency circuit 1 according to the first embodiment will be described with reference to FIGS. 3A and 3B.

In the radio-frequency circuit 1 according to the first embodiment, the single input matching circuit 8 is provided for the three receive paths (first, second, and third receive paths) as described above. Thus, for example, depending on at least either the position or orientation of the inductor 81 of the input matching circuit 8 relative to the inductor 131 of the matching circuit 13 and the inductor 141 of the matching circuit 14, the inductor 81 may cause magnetic coupling with the inductor 131 or 141.

The following description uses as an example the case in which the direction of current flow in the inductor 81 is changed between the first receive path and the second receive path, but the same description holds for the case in which the direction of current flow in the inductor 81 is changed between the first receive path and the third receive path and in the case in which the direction of current flow in the inductor 81 is changed between the second receive path and the third receive path.

Figure 3A:
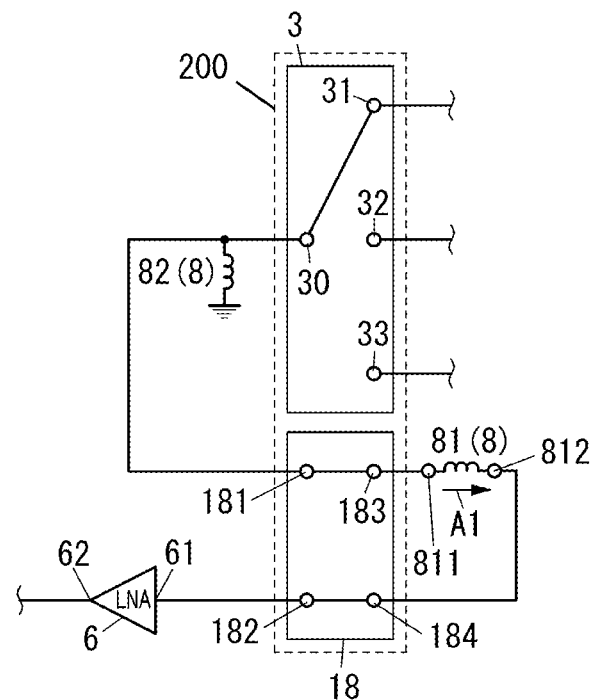
FIG. 3A illustrates connections of the switches in the first state in the radio-frequency circuit.
Figure 3B:
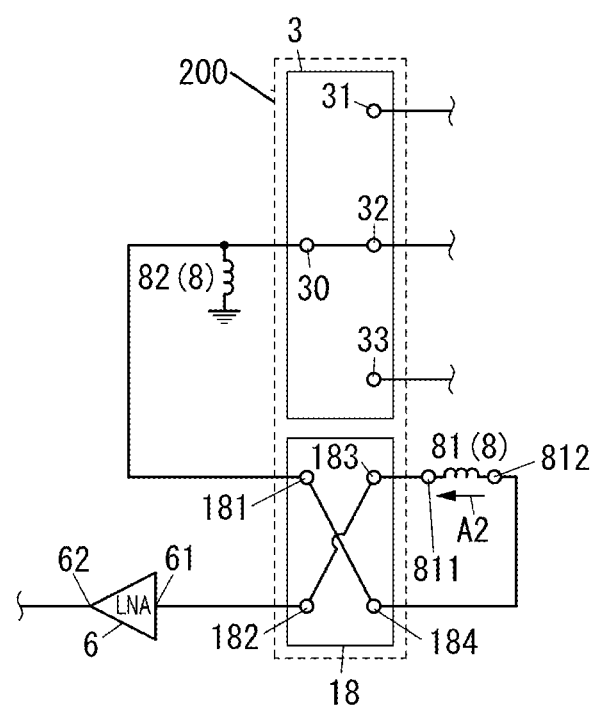
FIG. 3B illustrates connections of the switches in the second state in the radio-frequency circuit.

In FIG. 3A, the switch 18 is in the first state. When the switch 18 is in the first state, the terminal 181 as the first input-output terminal is coupled to the terminal 183 as the first switching terminal, and the terminal 182 as the second input-output terminal is coupled to the terminal 184 as the second switching terminal. In this case, a current flows through the inductor 81 of the input matching circuit 8 in the direction indicated by the arrow A1. Accordingly, a magnetic field is generated around the inductor 81 in the direction corresponding to the current. At this time, a current also flows through the inductor 131 of the matching circuit 13, and a magnetic field is generated around the inductor 131 in the direction corresponding to the current.

In this case, when the direction of the magnetic field generated around the inductor 81 of the input matching circuit 8 is opposite to the direction of the magnetic field generated around the inductor 131 of the matching circuit 13, the magnetic field generated around the inductor 81 and the magnetic field generated around the inductor 131 cancel each other out, and consequently, the magnetic coupling between the inductors 81 and 131 is hindered. This can suppress degradation of the isolation between the transmit and receive paths particularly in the transmit frequency band, and as a result, it is possible to reduce the likelihood of leaking transmit signals into the receive path and achieve favorable receive sensitivity during the transmit operation.

Next, when the terminal 181 as the first input-output terminal is coupled to the terminal 183 as the first switching terminal in the case of receiving the second receive signal through the second receive path, a current flows in the inductor 81 of the input matching circuit 8 in the direction indicated by the arrow A1, and a magnetic field is generated around the inductor 81 in the direction corresponding to the current. At this time, a current also flows through the inductor 141 of the matching circuit 14, and a magnetic field is generated around the inductor 141 in the direction corresponding to the current.

In this case, when the direction of the magnetic field generated around the inductor 81 is identical to the direction of the magnetic field around the inductor 141 so that the inductors 81 and 141 cause magnetic coupling, switching the switch 18 to the second state can hinder the magnetic coupling between the inductors 81 and 141. Specifically, in the switch 18, the terminal 181 as the first input-output terminal is coupled to the terminal 184 as the second switching terminal, and the terminal 182 as the second input-output terminal is coupled to the terminal 183 as the first switching terminal as illustrated in FIG. 3B. In this state, a current flows through the inductor 81 of the input matching circuit 8 in the direction indicated by the arrow A2 opposite to the arrow A1. Accordingly, a magnetic field is generated around the inductor 81 in the direction corresponding to the current.

As a result, the direction of the magnetic field generated around the inductor 81 is opposite to the direction of the magnetic field generated around the inductor 141, and the magnetic field generated around the inductor 81 and the magnetic field generated around the inductor 141 cancel each other out. As such, it is possible to hinder the magnetic coupling between the inductors 81 and 141. This can suppress degradation of the isolation between the transmit and receive paths particularly in the transmit frequency band, and as a result, it is possible to reduce the likelihood of leaking transmit signals into the receive path and achieve favorable receive sensitivity during the transmit operation. As described above, the radio-frequency circuit 1 according to the first embodiment can select (change), for each of the different communication bands, the direction of current flow in the inductor 81 of the input matching circuit 8, in other words, the direction of the magnetic field generated around the inductor 81. Furthermore, the input matching circuit 8 does not need to include inductors for different communication bands, and thus, the radio-frequency circuit 1 can be downsized.

In this case, the inductor in which the direction of current flow is changed by the switch is the inductor 81 of the input matching circuit 8, and the inductors that may cause magnetic coupling with this inductor are the inductor 131 of the matching circuit 13 and the inductor 141 of the matching circuit 14.

(5) MODIFICATIONS

The following provides descriptions of modifications of the first embodiment.

(5.1) First Modification

Figure 4A:
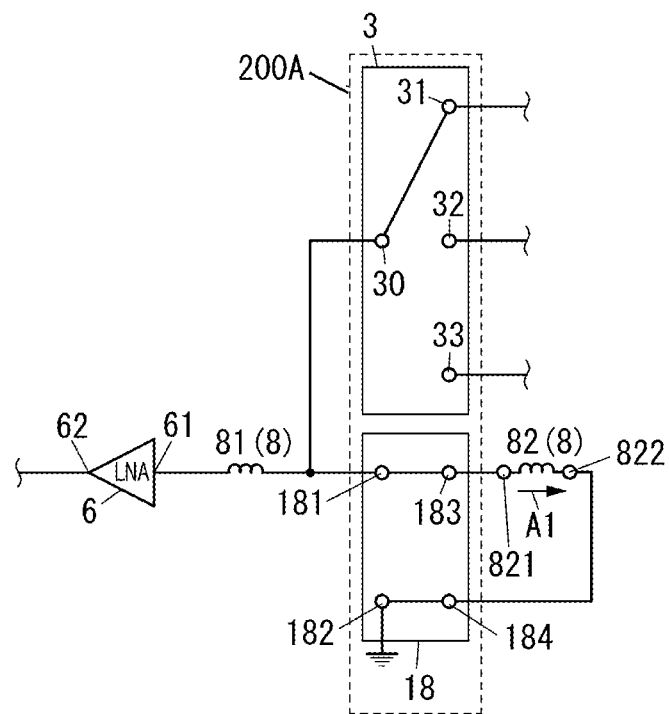
FIG. 4A illustrates connections of switches in a first state in a radio-frequency circuit according to a first modification of the first embodiment.
Figure 4B:
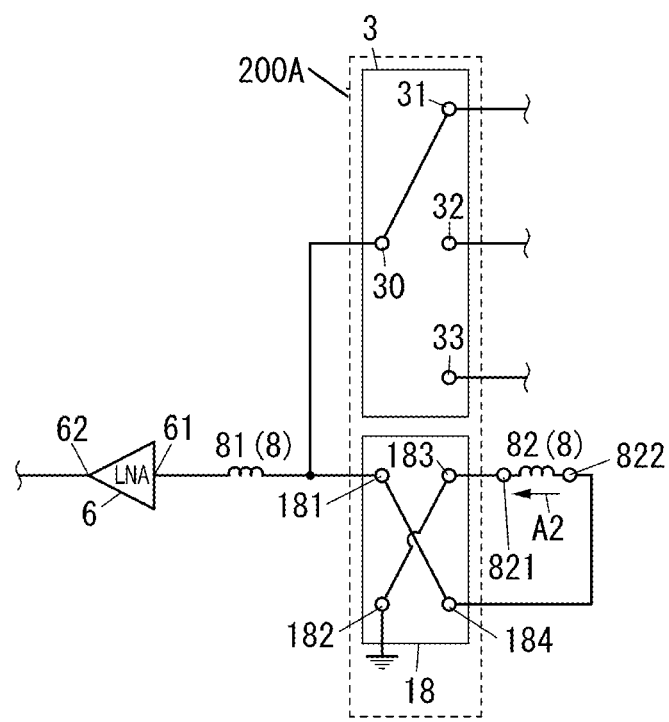
FIG. 4B illustrates connections of the switches in a second state in the radio-frequency circuit.

The radio-frequency circuit 1 according to the first embodiment is configured as illustrated in FIG. 1 such that, of the inductors 81 and 82 included in the input matching circuit 8, the direction of current flow in the inductor 81 is changeable. By contrast, as illustrated in FIGS. 4A and 4B, of the inductors 81 and 82 included in the input matching circuit 8, the direction of current flow in the inductor 82 may be changeable. The radio-frequency circuit 1 according to a first modification will be described below with reference to FIGS. 4A and 4B. Concerning the radio-frequency circuit 1 according to the first modification, substantially the same constituent elements as the radio-frequency circuit 1 according to the first embodiment are assigned the same reference characters, and descriptions thereof are not repeated.

The radio-frequency circuit 1 according to the first modification includes, as illustrated in FIGS. 4A and 4B, the switches 3 and 18. In the radio-frequency circuit 1 according to the first modification, the switches 3 and 18 are formed by a single chip component 200A; in other words, the switch 18 is integrated with the switch 3.

The switch 3 has the common terminal 30 and a plurality (three in FIG. 4A) of selection terminals of the selection terminals 31, 32, and 33 as illustrated in FIGS. 4A and 4B. The switch 3 switches connections between the common terminal 30 and the selection terminals 31, 32, and 33. More specifically, the switch 3 switches among the state in which the common terminal 30 is coupled to the selection terminal 31, the state in which the common terminal 30 is coupled to the selection terminal 32, and the state in which the common terminal 30 is coupled to the selection terminal 33. The switch 3 may be implemented by, for example, an SP3T switch.

The switch 18 has a plurality (four in FIG. 4A) of the terminals 181, 182, 183, and 184. The switch 18 can switch between the first state and the second state to reverse the direction of current flow in the inductor 82. In the first state, the terminal 181 is coupled to the terminal 183, and the terminal 182 is coupled to the terminal 184 (refer to FIG. 4A). In the second state, the terminal 181 is coupled to the terminal 184, and the terminal 182 is coupled to the terminal 183. The switch 18 may be implemented by, for example, a DPDT switch.

The common terminal 30 of the switch 3 is coupled to the terminal 181 of the switch 18. The common terminal 30 is also coupled to the input terminal 61 of the low-noise amplifier 6 via the inductor 81. The selection terminal 31 is coupled to the output terminal of the receive filter 102 of the duplexer 10. The selection terminal 32 is coupled to the output terminal of the receive filter 112 of the duplexer 11. The selection terminal 33 is coupled to the output terminal of the receive filter 122 of the duplexer 12.

The terminal 182 of the switch 18 is grounded. The terminal 183 of the switch 18 is coupled to a first end 821 of the inductor 82 of the input matching circuit 8, and the terminal 184 of the switch 18 is coupled to a second end 822 of the inductor 82. This means that the terminals 183 and 184 of the switch 18 are coupled to the both ends of the inductor 82.

In the radio-frequency circuit 1 according to the first modification, the terminal 181 is the first input-output terminal and, for example, an input terminal. In the radio-frequency circuit 1, the terminal 182 is the second input-output terminal and, for example, an output terminal. In the radio-frequency circuit 1, the terminal 183 is the first switching terminal, and the terminal 184 is the second switching terminal.

Next, an operation of the radio-frequency circuit 1 will be described with reference to FIGS. 4A and 4B. When the switch 18 is in the first state, as illustrated in FIG. 4A, the terminal 181 is coupled to the terminal 183, and the terminal 182 is coupled to the terminal 184. A current thus flows through the inductor 82 of the input matching circuit 8 in the direction indicated by the arrow A1. When the switch 18 is in the second state, as illustrated in FIG. 4B, the terminal 181 is coupled to the terminal 184, and the terminal 182 is coupled to the terminal 183. A current thus flows through the inductor 82 of the input matching circuit 8 in the direction indicated by the arrow A2. As described above, in the radio-frequency circuit 1 according to the first modification, the direction of current flow in the inductor 82 can be reversed by switching the switch 18 to the first state or the second state. Accordingly, it is possible to reverse the direction of the magnetic field generated around the inductor 82.

Also in the radio-frequency circuit 1 according to the first modification, the direction of the magnetic field generated around the inductor 82 of the input matching circuit 8 can be reversed by switching the switch 18 to the first state or the second state. Consequently, it is possible to hinder the magnetic coupling between the inductor 82 and another inductor (for example, the inductor 131 of the matching circuit 13).

In the radio-frequency circuit 1 according to the first modification, the direction of the magnetic field generated around the inductor 82 of the input matching circuit 8 can be changed for each of the different communication bands by switching the switch 18 to the first state or the second state.

With this configuration, the radio-frequency circuit 1 can be smaller than if inductors are provided for different communication bands.

(5.2) Second Modification

In the radio-frequency circuit 1 according to the first embodiment, the switch 18 is switched to the first state or the second state between, for example, the case of receiving the first receive signal through the first receive path and the case of transmitting the second receive signal through the second receive path. By contrast, the switch 18 may be switched to the first state or the second state between, for example, the case of receiving the first receive signal through the first receive path and the case of transmitting the second transmit signal through the second transmit path.

In this case, the first receive signal received through the first receive path and the second transmit signal transmitted by the second transmit path are simultaneously transmitted and received by, for example, carrier aggregation. In this case, the first receive signal and the second transmit signal may be simultaneously transmitted and received by, for example, dual connectivity.

In this case, the inductor in which the direction of current flow is changed by the switch is the inductor 81 (first inductor) of the input matching circuit 8, and the inductor that may cause magnetic coupling with this inductor is the inductor 72 (second inductor) coupled to the output side of the power amplifier 5.

Also in this case, by switching the switch 18 to the first state or the second state, it is possible to hinder the magnetic coupling between the inductors 72 and 81.

(5.3) Third Modification

In the radio-frequency circuit 1 according to the first modification the switch 3 for switching signal paths for receive signals in different communication bands is integrated with the switch 18 for changing the direction of current flow in the inductor 81, but the switches 3 and 18 may be separately formed.

Second Embodiment

A radio-frequency circuit 1A and a communication device 100A according to a second embodiment will be described with reference to FIGS. 5, 6A, and 6B.

The radio-frequency circuit 1A according to the second embodiment differs from the radio-frequency circuit 1 according to the first embodiment in that the direction of current flow in the inductor 72 of the output matching circuit 7 coupled to the output side of the power amplifier 5 is changeable.

Substantially the same constituent elements as the radio-frequency circuit 1 according to the first embodiment are assigned the same reference characters, and descriptions thereof are not repeated. The communication device 100A is the same as the communication device 100 according to the first embodiment except the radio-frequency circuit 1A, and the description thereof is not repeated.

(1) CONFIGURATION OF RADIO-FREQUENCY CIRCUIT

Firstly, a configuration of the radio-frequency circuit 1A according to the second embodiment will be described with reference to FIG. 5.

Figure 5:
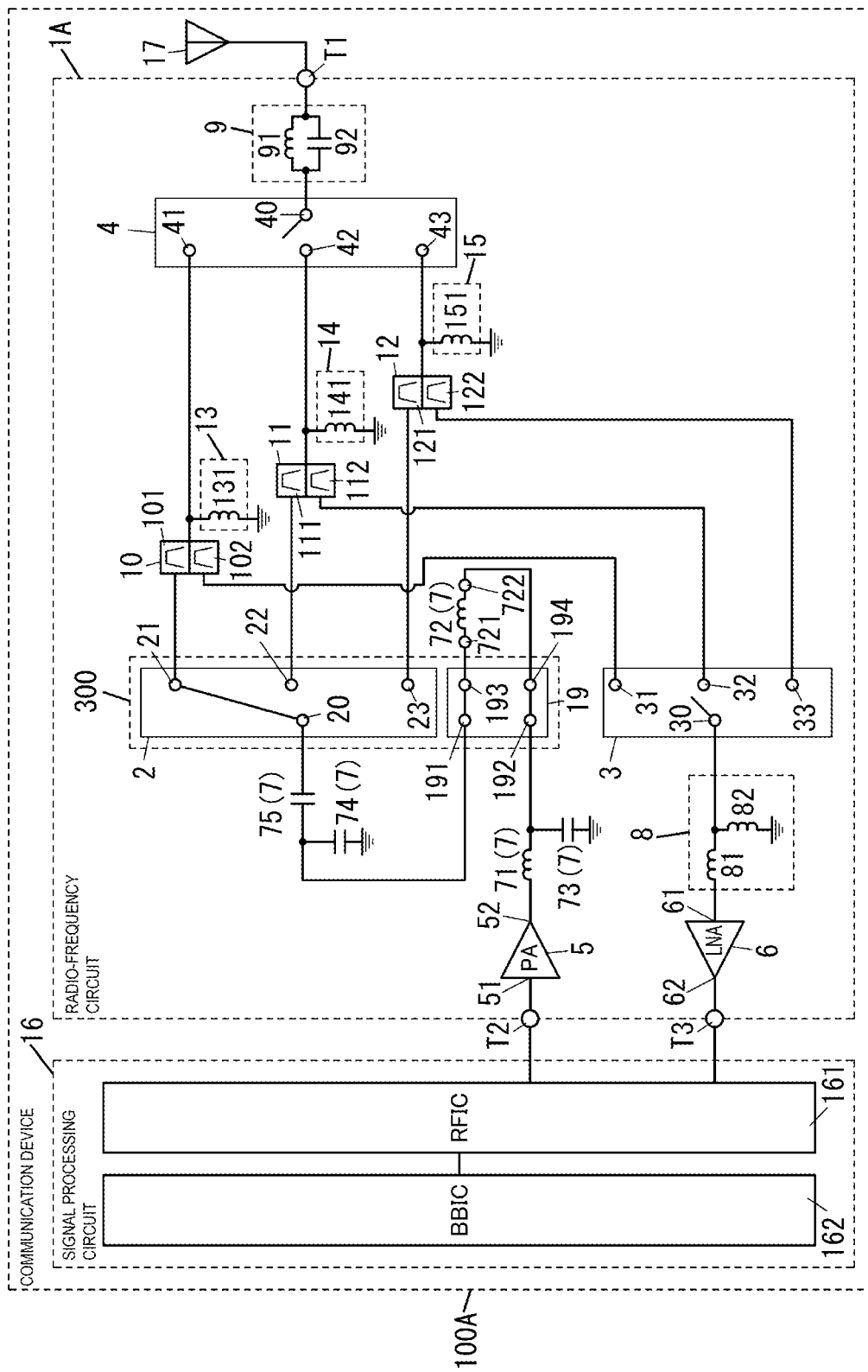
FIG. 5 is a circuit configuration diagram of a communication device including a radio-frequency circuit according to a second embodiment.

The radio-frequency circuit 1A according to the second embodiment includes the switches 2, 3, and 4 and a switch 19 as illustrated in FIG. 5. The radio-frequency circuit 1A further includes the power amplifier 5, the low-noise amplifier 6, and the low pass filter 9. The radio-frequency circuit 1A further includes a plurality (three in FIG. 5) of duplexers of the duplexers 10, 11, and 12. The radio-frequency circuit 1A further includes the output matching circuit 7, the input matching circuit 8, a plurality (three in FIG. 5) of matching circuits of the matching circuits 13, 14, and 15. In the radio-frequency circuit 1A according to the second embodiment, the switches 2 and 19 are implemented by a single chip component 300; in other words, the switch 19 for changing the direction of current flow in the inductor 72 is integrated with the switch 2 for switching signal paths for transmit signals in different communication bands. The term "integrated" means that the two switches 2 and 19 are physically integrated with each other.

The switch 2 has the common terminal 20 and a plurality (three in FIG. 5) of selection terminals of the selection terminals 21, 22, and 23 as illustrated in FIG. 5. The switch 2 switches connections between the common terminal 20 and the selection terminals 21, 22, and 23. More specifically, the switch 2 switches among the state in which the common terminal 20 is coupled to the selection terminal 21, the state in which the common terminal 20 is coupled to the selection terminal 22, and the state in which the common terminal 20 is coupled to the selection terminal 23. The switch 2 may be implemented by, for example, an SP3T switch.

The switch 19 has a plurality (four in FIG. 5) of terminals 191, 192, 193, and 194. The switch 19 can switch between a first state and a second state to reverse the direction of current flow in the inductor 72. In the first state, the terminal 191 is coupled to the terminal 193, and the terminal 192 is coupled to the terminal 194 (refer to FIG. 6A). In the second state, the terminal 191 is coupled to the terminal 194, and the terminal 192 is coupled to the terminal 193 (refer to FIG. 6B). The switch 19 may be implemented by, for example, a DPDT switch.

The common terminal 20 of the switch 2 is coupled to the terminal 191 of the switch 19 via the capacitor 75 of the output matching circuit 7. The selection terminal 21 is coupled to the input terminal of the transmit filter 101 of the duplexer 10. The selection terminal 22 is coupled to the input terminal of the transmit filter 111 of the duplexer 11. The selection terminal 23 is coupled to the input terminal of the transmit filter 121 of the duplexer 12.

The terminal 192 of the switch 19 is coupled to the output terminal 52 of the power amplifier 5 via the inductor 71 of the output matching circuit 7. The terminal 193 of the switch 19 is coupled to a first end 721 of the inductor 72 of the output matching circuit 7, and the terminal 194 of the switch 19 is coupled to a second end 722 of the inductor 72. This means that the terminals 193 and 194 of the switch 19 are coupled to the both ends of the inductor 72. The capacitor 74 of the output matching circuit 7 is coupled between the ground and a signal path between the capacitor 75 of the output matching circuit 7 and the terminal 191 of the switch 19. The capacitor 73 of the output matching circuit 7 is coupled between the ground and a signal path between the inductor 71 of the output matching circuit 7 and the terminal 192 of the switch 19.

The switch 3 has the common terminal 30 and a plurality (three in FIG. 5) of selection terminals of the selection terminals 31, 32, and 33. The switch 3 switches connections between the common terminal 30 and the selection terminals 31, 32, and 33. More specifically, the switch 3 switches among the state in which the common terminal 30 is coupled to the selection terminal 31, the state in which the common terminal 30 is coupled to the selection terminal 32, and the state in which the common terminal 30 is coupled to the selection terminal 33. The switch 3 may be implemented by, for example, an SP3T switch.

The common terminal 30 is coupled to the input terminal 61 of the low-noise amplifier 6 via the inductor 81 of the input matching circuit 8. The selection terminal 31 is coupled to the receive filter 102 of the duplexer 10. The selection terminal 32 is coupled to the receive filter 112 of the duplexer 11. The selection terminal 33 is coupled to the receive filter 122 of the duplexer 12.

In the radio-frequency circuit 1A according to the second embodiment, the terminal 191 is the first input-output terminal and, for example, an output terminal. In the radio-frequency circuit 1A, the terminal 192 is the second input-output terminal and, for example, an input terminal. In the radio-frequency circuit 1A, the terminal 193 is the first switching terminal, and the terminal 194 is the second switching terminal.

(2) OPERATION OF RADIO-FREQUENCY CIRCUIT

(2.1) First Operation

Next, an operation of the radio-frequency circuit 1A according to the second embodiment will be described with reference to FIGS. 6A and 6B.

In the radio-frequency circuit 1A according to the second embodiment, for example, the output matching circuit 7 includes the inductor 72 mounted at a mounting board (not illustrated in the drawing). In the radio-frequency circuit 1A, for example, the matching circuit 13 includes the inductor 131 mounted at the mounting board. Depending on at least either the position or orientation of the inductor 72 of the output matching circuit 7 relative to the inductor 131 of the matching circuit 13, the inductors 72 and 131 may cause magnetic coupling. This may worsen the isolation between the transmit and receive paths particularly in the receive frequency band, and as a result, noises in the receive band may increase at the time of transmission, resulting in degradation of receive sensitivity during the transmit operation.

To address the problem described above, the radio-frequency circuit 1A according to the second embodiment is configured in the following manner. The following description uses an example of the magnetic coupling between the inductor 72 of the output matching circuit 7 and the inductor 131 of the matching circuit 13, but the same description holds for the magnetic coupling between the inductor 72 of the output matching circuit 7 and the inductor 141 of the matching circuit 14 and the magnetic coupling between the inductor 72 of the output matching circuit 7 and the inductor 151 of the matching circuit 15. Also, the following description uses as an example the case in which the common terminal 20 of the switch 2 is coupled to the selection terminal 21, but the same description holds for the case in which the common terminal 20 is coupled to the selection terminal 22 or the selection terminal 23.

In the radio-frequency circuit 1A according to the second embodiment, the inductor in which the direction of current flow is changed by the switch is the inductor 72 coupled to the output side of the power amplifier 5. In the radio-frequency circuit 1A according to the second embodiment, the inductors that may cause magnetic coupling with the inductor described above are the inductor 131 of the matching circuit 13, the inductor 141 of the matching circuit 14, and the inductor 151 of the matching circuit 15.

Figure 6A:
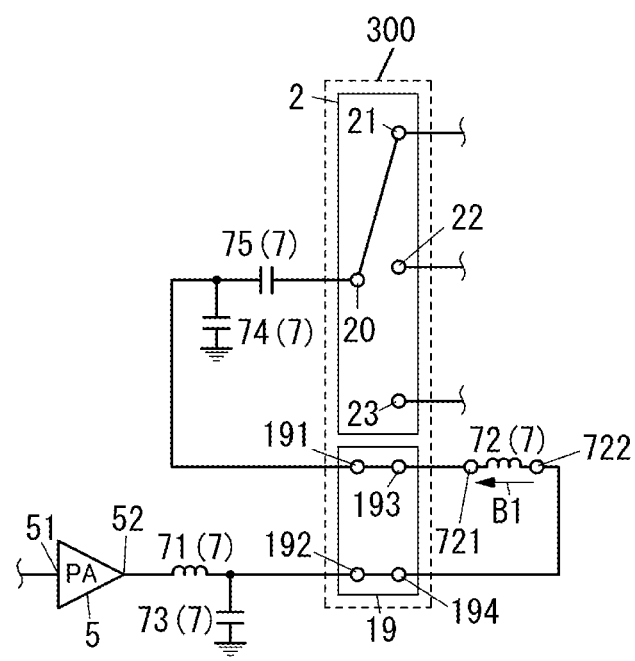
FIG. 6A illustrates connections of switches in a first state in the radio-frequency circuit.

In FIG. 6A, the switch 19 is in the first state. When the switch 19 is in the first state, the terminal 191 as the first input-output terminal is coupled to the terminal 193 as the first switching terminal, and the terminal 192 as the second input-output terminal is coupled to the terminal 194 as the second switching terminal. In this case, a current flows through the inductor 72 of the output matching circuit 7 in the direction indicated by an arrow B1. Accordingly, a magnetic field is generated around the inductor 72 in the direction corresponding to the current. At this time, a current also flows through the inductor 131 of the matching circuit 13, and a magnetic field is generated around the inductor 131 in the direction corresponding to the current.

When the direction of the magnetic field generated around the inductor 72 is identical to the direction of the magnetic field generated around the inductor 131, the magnetic field generated around the inductor 72 and the magnetic field generated around the inductor 131 strengthen each other, and consequently, the inductors 72 and 131 cause magnetic coupling. This worsens the isolation between the transmit and receive paths particularly in the receive frequency band, and as a result, noises in the receive band increase at the time of transmission, resulting in degradation of receive sensitivity during the transmit operation.

Figure 6B:
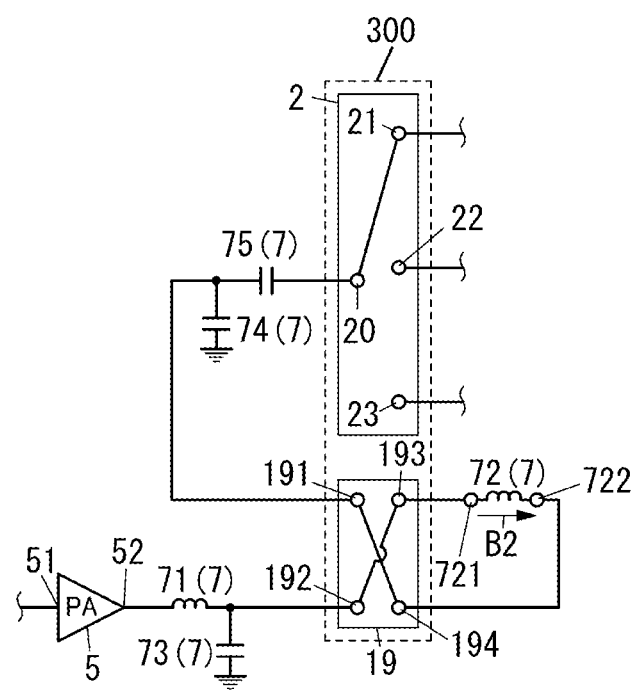
FIG. 6B illustrates connections of the switches in a second state in the radio-frequency circuit.

In this case, the direction of current flow in the inductor 72 can be reversed by switching the switch 19 to the second state as illustrated in FIG. 6B. Specifically, in the switch 19, the terminal 191 as the first input-output terminal is coupled to the terminal 194 as the second switching terminal, and the terminal 192 as the second input-output terminal is coupled to the terminal 193 as the first switching terminal. In this state, a current flows through the inductor 72 of the output matching circuit 7 in the direction indicated by an arrow B2 opposite to the arrow B1. Accordingly, a magnetic field is generated around the inductor 72 in the direction corresponding to the current.

In this case, the direction of the magnetic field generated around the inductor 72 is opposite to the direction of the magnetic field generated around the inductor 131, and the magnetic field generated around the inductor 72 and the magnetic field generated around the inductor 131 cancel each other out. As such, it is possible to hinder the magnetic coupling between the inductors 72 and 131. This can suppress degradation of the isolation between the transmit and receive paths particularly in the receive frequency band, and as a result, it is possible to reduce noises in the receive band at the time of transmission and suppress degradation of receive sensitivity during the transmit operation.

Similarly, by switching the switch 19 between the first state and the second state, it is possible to hinder the magnetic coupling between the inductor 72 of the output matching circuit 7 and the inductor 81 of the input matching circuit 8 and the magnetic coupling between the inductor 72 of the output matching circuit 7 and the inductor 91 of the low pass filter 9. In this case, the inductor in which the direction of current flow is changed by the switch is the inductor 72 of the output matching circuit 7, and the inductors that may cause magnetic coupling with this inductor are the inductor 81 of the input matching circuit 8 and the inductor 91 of the low pass filter 9.

(2.2) Second Operation

Next, a second operation of the radio-frequency circuit 1A according to the second embodiment will be described.

In the radio-frequency circuit 1A according to the second embodiment, the single output matching circuit 7 is provided for the three transmit paths (first, second, and third transmit paths) as described above. Thus, for example, depending on at least either the position or orientation of the inductor 72 of the output matching circuit 7 relative to the inductor 131 of the matching circuit 13 and the inductor 141 of the matching circuit 14, the inductor 72 may cause magnetic coupling with the inductor 131 or 141.

The following description uses as an example the case in which the direction of current flow in the inductor 72 is changed between the first transmit path and the second transmit path, but the same description holds for the case in which the direction of current flow in the inductor 72 is changed between the first transmit path and the third transmit path and in the case in which the direction of current flow in the inductor 72 is changed between the second transmit path and the third transmit path.

When the switch 19 is in the first state, the terminal 191 as the first input-output terminal is coupled to the terminal 193 as the first switching terminal, and the terminal 192 as the second input-output terminal is coupled to the terminal 194 as the second switching terminal. In the switch 2, the common terminal 20 is coupled to the selection terminal 21. In this case, a current flows through the inductor 72 of the output matching circuit 7 in the direction indicated by the arrow B1. Accordingly, a magnetic field is generated around the inductor 72 in the direction corresponding to the current. At this time, a current also flows through the inductor 131 of the matching circuit 13, and a magnetic field is generated around the inductor 131 in the direction corresponding to the current.

In this case, when the direction of the magnetic field generated around the inductor 72 of the output matching circuit 7 is opposite to the direction of the magnetic field generated around the inductor 131 of the matching circuit 13, the magnetic field generated around the inductor 72 and the magnetic field generated around the inductor 131 cancel each other out, and consequently, the magnetic coupling between the inductors 72 and 131 is hindered. This can suppress degradation of the isolation between the transmit and receive paths particularly in the receive frequency band, and as a result, it is possible to reduce noises in the receive band at the time of transmission and suppress degradation of receive sensitivity during the transmit operation.

Next, when the terminal 191 as the first input-output terminal is coupled to the terminal 193 as the first switching terminal in the case of transmitting the second transmit signal through the second transmit path, a current flows in the inductor 72 of the output matching circuit 7 in the direction indicated by the arrow B1, and a magnetic field is generated around the inductor 72 in the direction corresponding to the current. At this time, because the common terminal 20 is coupled to the selection terminal 22 in the switch 2, a current also flows through the inductor 141 of the matching circuit 14, and a magnetic field is generated around the inductor 141 in the direction corresponding to the current.

In this case, when the direction of the magnetic field generated around the inductor 72 is identical to the direction of the magnetic field around the inductor 141 so that the inductors 72 and 141 cause magnetic coupling, switching the switch 19 to the second state can hinder the magnetic coupling between the inductors 72 and 141. Specifically, in the switch 19, the terminal 191 as the first input-output terminal is coupled to the terminal 194 as the second switching terminal, and the terminal 192 as the second input-output terminal is coupled to the terminal 193 as the first switching terminal. In this state, a current flows through the inductor 72 of the output matching circuit 7 in the direction indicated by the arrow B2 opposite to the arrow B1. Accordingly, a magnetic field is generated around the inductor 72 in the direction corresponding to the current.

As a result, the direction of the magnetic field generated around the inductor 72 is opposite to the direction of the magnetic field generated around the inductor 141, and the magnetic field generated around the inductor 72 and the magnetic field generated around the inductor 141 cancel each other out. As such, it is possible to hinder the magnetic coupling between the inductors 72 and 141. This can suppress degradation of the isolation between the transmit and receive paths particularly in the receive frequency band, and as a result, it is possible to reduce noises in the receive band at the time of transmission and suppress degradation of receive sensitivity during the transmit operation. As described above, the radio-frequency circuit 1A according to the second embodiment can select (change), for each of the different communication bands, the direction of current flow in the inductor 72 of the output matching circuit 7, in other words, the direction of the magnetic field generated around the inductor 72. Moreover, the radio-frequency circuit 1A can be smaller than if inductors are provided for different communication bands.

In this case, the inductor in which the direction of current flow is changed by the switch is the inductor 72 of the output matching circuit 7, and the inductors that may cause magnetic coupling with this inductor are the inductors 131, 141, and 151 of the matching circuits 13, 14, and 15.

(3) MODIFICATIONS

The following provides descriptions of modifications of the second embodiment.

(3.1) First Modification

In the radio-frequency circuit 1A according to the second embodiment, the switch 19 is switched to the first state or the second state between, for example, the case of transmitting the first transmit signal through the first transmit path and the case of transmitting the second transmit signal through the second transmit path. By contrast, the switch 19 may be switched to the first state or the second state between, for example, the case of transmitting the first transmit signal through the first transmit path and the case of receiving the second receive signal through the second receive path.

In this case, the first transmit signal transmitted through the first transmit path and the second receive signal received by the second receive path are simultaneously transmitted and received by, for example, carrier aggregation. In this case, the first transmit signal and the second receive signal may be simultaneously transmitted and received by, for example, dual connectivity.

In this case, the inductor in which the direction of current flow is changed by the switch is the inductor 72 (first inductor) coupled to the output side of the power amplifier 5, and the inductor that may cause magnetic coupling with this inductor is the inductor 81 (second inductor) coupled to the input side of the low-noise amplifier 6.

Also in this case, by switching the switch 19 to the first state or the second state, it is possible to hinder the magnetic coupling between the inductors 72 and 81.

(3.2) Second Modification

In the radio-frequency circuit 1A according to the second embodiment the switch 2 for switching signal paths for receive signals in different communication bands is integrated with the switch 19 for changing the direction of current flow in the inductor 72, but the switches 2 and 19 may be separately formed.

Third Embodiment

A radio-frequency circuit 1B and a communication device 100B according to a third embodiment will be described with reference to FIGS. 7, 8A, and 8B.

The radio-frequency circuit 1B according to the third embodiment differs from the radio-frequency circuit 1 according to the first embodiment and the radio-frequency circuit 1A according to the second embodiment in that the direction of current flow in the inductor 91 included in the low pass filter 9 is changeable. Substantially the same constituent elements as the radio-frequency circuit 1 according to the first embodiment or the radio-frequency circuit 1A according to the second embodiment are assigned the same reference characters, and descriptions thereof are not repeated. The communication device 100B is the same as the communication device 100 according to the first embodiment except the radio-frequency circuit 1B, and the description thereof is not repeated.

(1) CONFIGURATION OF RADIO-FREQUENCY CIRCUIT

Firstly, the radio-frequency circuit 1B according to the third embodiment will be described with reference to FIG. 7.

Figure 7:
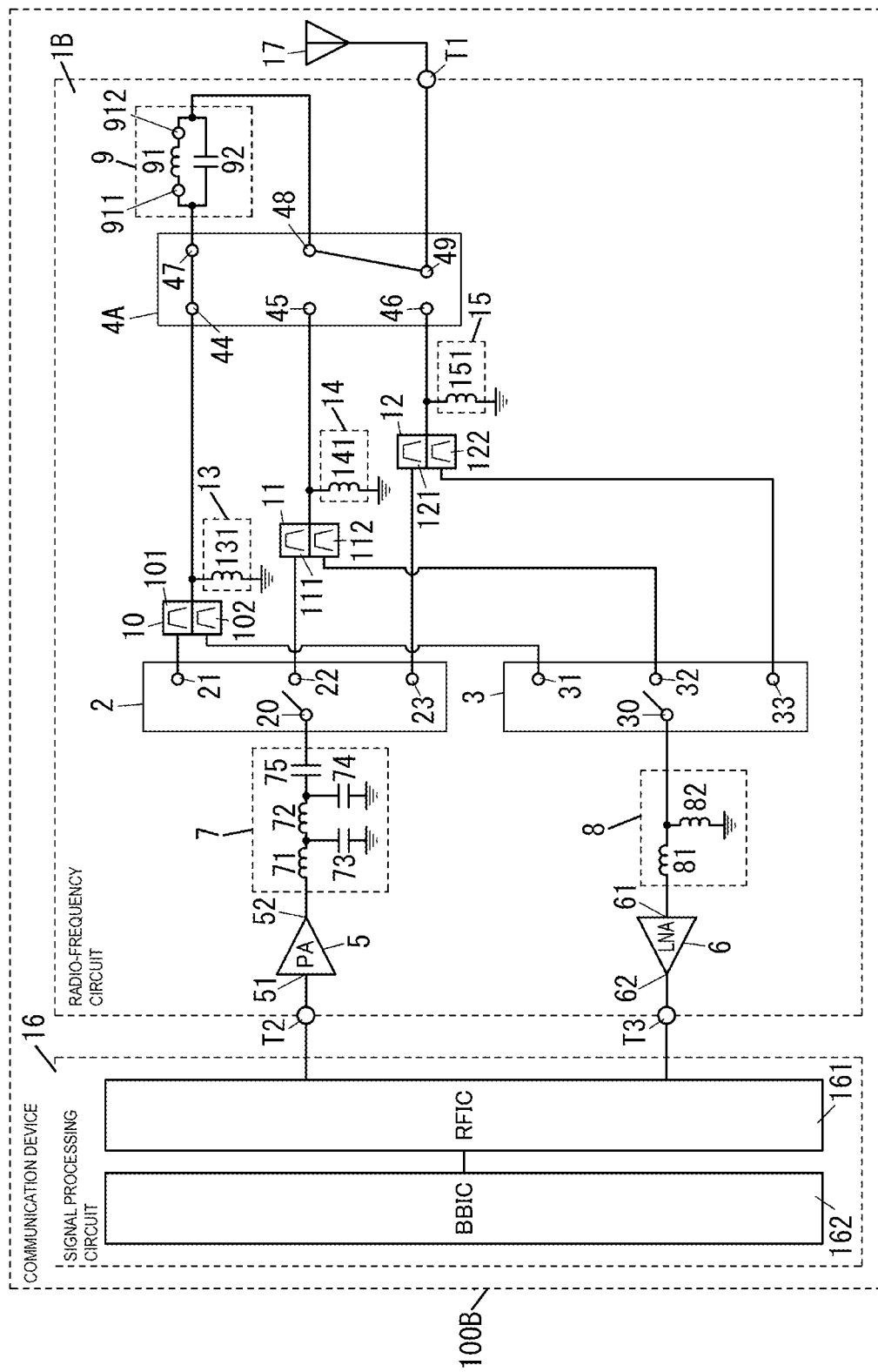
FIG. 7 is a circuit configuration diagram of a communication device including a radio-frequency circuit according to a third embodiment.

The radio-frequency circuit 1B according to the third embodiment includes the switches 2 and 3 and a switch 4A as illustrated in FIG. 7. The radio-frequency circuit 1B further includes the power amplifier 5, the low-noise amplifier 6, and the low pass filter 9. The radio-frequency circuit 1B further includes a plurality (three in FIG. 7) of duplexers of the duplexers 10, 11, and 12. The radio-frequency circuit 1B further includes the output matching circuit 7, the input matching circuit 8, a plurality (three in FIG. 5) of matching circuits of the matching circuits 13, 14, and 15.

The switch 4A has terminals 44, 45, and 46 serving as the first input-output terminal, a terminal 49 as the second input-output terminal, a terminal 47 as the first switching terminal, and a terminal 48 as the second switching terminal. The terminals 44, 45, and 46 serving as the first input-output terminal are, for example, input terminals. The terminal 49 serving as the second input-output terminal is, for example, an output terminal. The switch 4A switches connections between the terminals 47 and 48 and the terminals 44, 45, 46, and 49. The switch 4A may be implemented by, for example, a dual pole quadruple throw (DP4T) switch.

The terminal 44 of the switch 4A is coupled to the duplexer 10. The terminal 45 of the switch 4A is coupled to the duplexer 11. The terminal 46 of the switch 4A is coupled to the duplexer 12. The terminal 47 of the switch 4A is coupled to a first end 911 of the inductor 91 of the low pass filter 9. The terminal 48 of the switch 4A is coupled to a second end 912 of the inductor 91. The terminal 49 of the switch 4A is coupled to the antenna terminal T1.

The switch 4A can switch between a first state and a second state to reverse the direction of current flow in the inductor 91. In the first state, the terminal 44, 45, or 46 as the first input-output terminal is coupled to the terminal 47 as the first switching terminal, and the terminal 49 as the second input-output terminal is coupled to the terminal 48 as the second switching terminal (refer to FIG. 8A). In the second state, the terminal 44, 45, or 46 as the first input-output terminal is coupled to the terminal 48 as the second switching terminal, and the terminal 49 as the second input-output terminal is coupled to the terminal 47 as the first switching terminal (refer to FIG. 8B).

This means that in the radio-frequency circuit 1B according to the third embodiment the single switch 4A implements both a switch electrically coupled to the antenna terminal T1 and a switch for changing the direction of current flow in the inductor 91; in other words, a switch for changing the direction of current flow in the inductor 91 is integrated with a switch electrically coupled to the antenna terminal T1. The term "integrated" means that the two switches are functionally and physically integrated with each other.

(2) OPERATION OF RADIO-FREQUENCY CIRCUIT (2.1) First Operation

Next, a first operation of the radio-frequency circuit 1B according to the third embodiment will be described with reference to FIGS. 8A and 8B.

In the radio-frequency circuit 1B according to the third embodiment, for example, the low pass filter 9 includes the inductor 91 mounted at a mounting board (not illustrated in the drawing). In the radio-frequency circuit 1B, for example, the output matching circuit 7 includes the inductor 72 mounted at the mounting board. Depending on at least either the position or orientation of the inductor 91 of the low pass filter 9 relative to the inductor 72 of the output matching circuit 7, the inductors 72 and 91 may cause magnetic coupling. This may degrade the attenuation (degree of reduction) of harmonic waves of transmit signals transmitted by the antenna 17 to the outside.

To address the problem described above, the radio-frequency circuit 1B according to the third embodiment is configured in the following manner. The following description uses an example of the magnetic coupling between the inductor 91 of the low pass filter 9 and the inductor 72 of the output matching circuit 7, but the same description holds for the magnetic coupling between the inductor 91 of the low pass filter 9 and the inductor 81 of the input matching circuit 8. Also, the following description uses as an example the case in which the first input-output terminal is the terminal 44, but the same description holds for the case in which the first input-output terminal is the terminal 45 or 46.

In the radio-frequency circuit 1B according to the third embodiment, the inductor in which the direction of current flow is changed by the switch is the inductor 91 included in the low pass filter 9, and the inductor that may cause magnetic coupling with this inductor is the inductor 72 of the output matching circuit 7 or the inductor 81 of the input matching circuit 8.

Figure 8A:
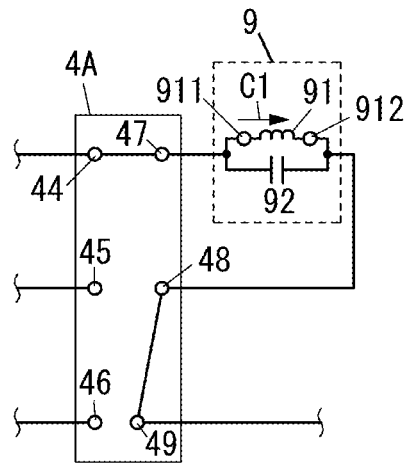
FIG. 8A illustrates connections of switches in a first state in the radio-frequency circuit.

In FIG. 8A, the switch 4A is in the first state. When the switch 4A is in the first state, the terminal 44 as the first input-output terminal is coupled to the terminal 47 as the first switching terminal, and the terminal 49 as the second input-output terminal is coupled to the terminal 48 as the second switching terminal. In this case, a current flows through the inductor 91 of the low pass filter 9 in the direction indicated by an arrow C1. Accordingly, a magnetic field is generated around the inductor 91 in the direction corresponding to the current. At this time, a current also flows through the inductor 72 of the output matching circuit 7, and a magnetic field is generated around the inductor 72 in the direction corresponding to the current.

When the direction of the magnetic field generated around the inductor 91 is identical to the direction of the magnetic field generated around the inductor 72, the magnetic field generated around the inductor 91 and the magnetic field generated around the inductor 72 strengthen each other, and consequently, the inductors 91 and 72 cause magnetic coupling. This degrades the attenuation of harmonic waves of transmit signals transmitted by the antenna 17 to the outside.

Figure 8B:
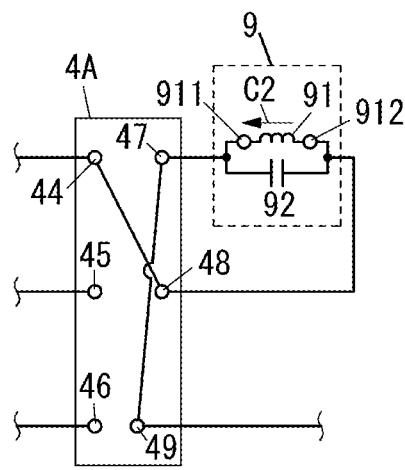
FIG. 8B illustrates connections of the switches in a second state in the radio-frequency circuit.

In this case, the direction of current flow in the inductor 91 can be reversed by switching the switch 4A to the second state as illustrated in FIG. 8B. Specifically, in the switch 4A, the terminal 44 as the first input-output terminal is coupled to the terminal 48 as the second switching terminal, and the terminal 49 as the second input-output terminal is coupled to the terminal 47 as the first switching terminal. In this state, a current flows through the inductor 91 of the low pass filter 9 in the direction indicated by an arrow C2 opposite to the arrow C1. Accordingly, a magnetic field is generated around the inductor 91 in the direction corresponding to the current.

In this case, the direction of the magnetic field generated around the inductor 91 is opposite to the direction of the magnetic field generated around the inductor 72, and the magnetic field generated around the inductor 91 and the magnetic field generated around the inductor 72 cancel each other out. As such, it is possible to hinder the magnetic coupling between the inductors 91 and 72. As a result, it is possible to suppress degradation of the attenuation of harmonic waves of transmit signals transmitted by the antenna 17 to the outside.

(2.2) Second Operation

Next, a second operation of the radio-frequency circuit 1B according to the third embodiment will be described.

In the radio-frequency circuit 1B according to the third embodiment, the single low pass filter 9 is provided for the three transmit paths (first, second, and third transmit paths) as described above. Thus, for example, depending on at least either the position or orientation of the inductor 91 of the low pass filter 9 relative to the inductor 131 of the matching circuit 13 and the inductor 141 of the matching circuit 14, the inductor 91 may cause magnetic coupling with the inductor 131 or 141.

The following description uses as an example the case in which the direction of current flow in the inductor 91 is changed between the first transmit path and the second transmit path, but the same description holds for the case in which the direction of current flow in the inductor 91 is changed between the first transmit path and the third transmit path and in the case in which the direction of current flow in the inductor 91 is changed between the second transmit path and the third transmit path.

When the switch 4A is in the first state, the terminal 44 as the first input-output terminal is coupled to the terminal 47 as the first switching terminal, and the terminal 49 as the second input-output terminal is coupled to the terminal 48 as the second switching terminal. In this case, a current flows through the inductor 91 of the low pass filter 9 in the direction indicated by the arrow C1. Accordingly, a magnetic field is generated around the inductor 91 in the direction corresponding to the current. At this time, a current also flows through the inductor 131 of the matching circuit 13, and a magnetic field is generated around the inductor 131 in the direction corresponding to the current.

In this case, when the direction of the magnetic field generated around the inductor 91 of the low pass filter 9 is opposite to the direction of the magnetic field generated around the inductor 131 of the matching circuit 13, the magnetic field generated around the inductor 91 and the magnetic field generated around the inductor 131 cancel each other out, and consequently, the magnetic coupling between the inductors 91 and 131 is hindered. As a result, it is possible to suppress degradation of the attenuation of harmonic waves of transmit signals transmitted by the antenna 17 to the outside.

Next, when the terminal 45 as the first input-output terminal is coupled to the terminal 47 as the first switching terminal in the case of transmitting the second transmit signal through the second transmit path, a current flows in the inductor 91 of the low pass filter 9 in the direction indicated by the arrow C1, and a magnetic field is generated around the inductor 91 in the direction corresponding to the current. At this time, a current also flows through the inductor 141 of the matching circuit 14, and a magnetic field is generated around the inductor 141 in the direction corresponding to the current.

In this case, when the direction of the magnetic field generated around the inductor 91 is identical to the direction of the magnetic field around the inductor 141 so that the inductors 91 and 141 cause magnetic coupling, switching the switch 4A to the second state can hinder the magnetic coupling between the inductors 91 and 141. Specifically, in the switch 4A, the terminal 45 as the first input-output terminal is coupled to the terminal 48 as the second switching terminal, and the terminal 49 as the second input-output terminal is coupled to the terminal 47 as the first switching terminal. In this state, a current flows through the inductor 91 of the low pass filter 9 in the direction indicated by the arrow C2 opposite to the arrow C1. Accordingly, a magnetic field is generated around the inductor 91 in the direction corresponding to the current.

As a result, the direction of the magnetic field generated around the inductor 91 is opposite to the direction of the magnetic field generated around the inductor 141, and the magnetic field generated around the inductor 91 and the magnetic field generated around the inductor 141 cancel each other out. As such, it is possible to hinder the magnetic coupling between the inductors 91 and 141. As a result, it is possible to suppress degradation of the attenuation of harmonic waves of transmit signals transmitted by the antenna 17 to the outside. As described above, the radio-frequency circuit 1B according to the third embodiment can select (change), for each of the different communication bands, the direction of current flow in the inductor 91 of the low pass filter 9, in other words, the direction of the magnetic field generated around the inductor 91. Moreover, the radio-frequency circuit 1B can be smaller than if inductors are provided for different communication bands.

In this case, the inductor in which the direction of current flow is changed by the switch is the inductor 91 included in the low pass filter 9, and the inductors that may cause magnetic coupling with this inductor are the inductors 131, 141, and 151 of the matching circuits 13, 14, and 15.

(3) MODIFICATIONS

The following provides descriptions of modifications of the third embodiment.

(3.1) First Modification

In the radio-frequency circuit 1B according to the third embodiment, the single switch 4A implements both the switch for switching signal paths for receive signals (or transmit signals) in different communication bands and the switch for changing the direction of current flow in the inductor 91 as illustrated in FIG. 7.

Figure 9:
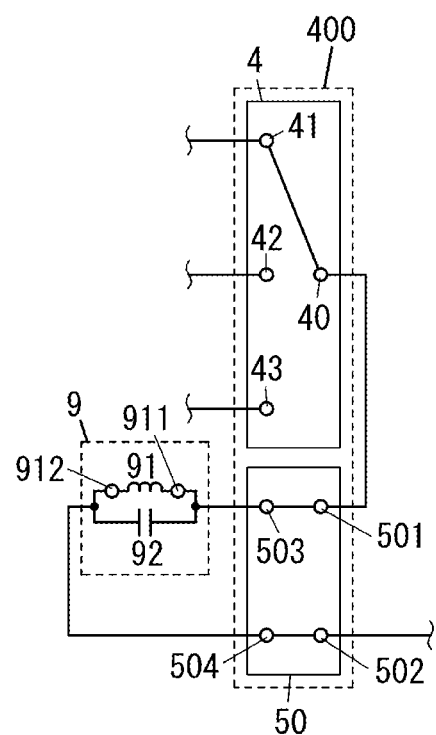
FIG. 9 is a circuit configuration diagram of switches in a radio-frequency circuit according to a first modification of the third embodiment.

However, a single chip component 400 may implement both the switch 4 for switching signal paths for receive signals (or transmit signals) in different communication bands and a switch 50 for changing the direction of current flow in the inductor 91 as illustrated in FIG. 9; in other words, the switch 50 for changing the direction of current flow in the inductor 91 may be integrated with the switch 4 for switching signal paths for receive signals (or transmit signals) in different communication bands. The term "integrated" means that the two switches (the switches 4 and 50) are physically integrated with each other. Hereinafter, the radio-frequency circuit 1B according to a first modification will be described with reference to FIG. 9. Concerning the radio-frequency circuit 1B according to the first modification, substantially the same constituent elements as the radio-frequency circuit 1B according to the third embodiment are assigned the same reference characters, and descriptions thereof are not repeated.

The radio-frequency circuit 1B according to the first modification includes the switches 4 and 50 instead of the switch 4A, as illustrated in FIG. 9. In the radio-frequency circuit 1B according to the first modification, the switches 4 and 50 are formed by the single chip component 400; in other words, the switch 50 is integrated with the switch 4.

The switch 4 has, as illustrated in FIG. 9, the common terminal 40 and a plurality (three in FIG. 9) of selection terminals of the selection terminals 41, 42, and 43. The switch 4 switches connections between the common terminal 40 and the selection terminals 41, 42, and 43. More specifically, the switch 4 switches among the state in which the common terminal 40 is coupled to the selection terminal 41, the state in which the common terminal 40 is coupled to the selection terminal 42, and the state in which the common terminal 40 is coupled to the selection terminal 43. The switch 4 may be implemented by, for example, an SP3T switch.

The switch 50 has a plurality (four in FIG. 9) of terminals of terminals 501, 502, 503, and 504. The switch 50 can switch between a first state and a second state to reverse the direction of current flow in the inductor 91. In the first state, the terminal 501 is coupled to the terminal 503, and the terminal 502 is coupled to the terminal 504 (refer to FIG. 9). In the second state, the terminal 501 is coupled to the terminal 504, and the terminal 502 is coupled to the terminal 503. The switch 50 may be implemented by, for example, a DPDT switch.

The common terminal 40 of the switch 4 is coupled to the terminal 501 of the switch 50. The selection terminal 41 is coupled to the output terminal of the transmit filter 101 of the duplexer 10 and the input terminal of the receive filter 102. The selection terminal 42 is coupled to the output terminal of the transmit filter 111 of the duplexer 11 and the input terminal of the receive filter 112. The selection terminal 43 is coupled to the output terminal of the transmit filter 121 of the duplexer 12 and the input terminal of the receive filter 122.

The terminal 502 of the switch 50 is coupled to the antenna terminal T1. The terminal 503 of the switch 50 is coupled to the first end 911 of the inductor 91 of the low pass filter 9, and the terminal 504 of the switch 50 is coupled to the second end 912 of the inductor 91. The terminal 503 of the switch 50 is also coupled to the first end of the capacitor 92 of the low pass filter 9, and the terminal 504 of the switch 50 is coupled to the second end of the capacitor 92. This means that the inductor 91 and the capacitor 92 are coupled in parallel with each other between the terminals 503 and 504 of the switch 50.

In the radio-frequency circuit 1B according to the first modification, the terminal 501 is the first input-output terminal and, for example, an input terminal. In the radio-frequency circuit 1B, the terminal 502 is the second input-output terminal and, for example, an output terminal. In the radio-frequency circuit 1B, the terminal 503 is the first switching terminal, and the terminal 504 is the second switching terminal.

Also in the radio-frequency circuit 1B according to the first modification, the direction of the magnetic field generated around the inductor 91 of the low pass filter 9 can be reversed by switching the switch 50 between the first state and the second state. Consequently, it is possible to hinder the magnetic coupling between the inductor 91 and another inductor (for example, the inductor 72 of the output matching circuit 7).

In the radio-frequency circuit 1B according to the first modification, the direction of the magnetic field generated around the inductor 91 of the low pass filter 9 can be changed for each of the different communication bands by switching the switch 50 to the first state or the second state. With this configuration, the radio-frequency circuit 1B can be smaller than if inductors are provided for different communication bands.

(3.2) Second Modification

In the radio-frequency circuit 1B according to the first modification the switch 4 for switching signal paths for receive signals in different communication bands is integrated with the switch 50 for changing the direction of current flow in the inductor 91, but the switches 4 and 50 may be separately formed.

(Aspects)

According to the above description including the embodiments, the following aspects are disclosed.

A radio-frequency circuit (1; 1A; 1B) according to a first aspect includes an inductor (81; 82; 72; 91) and a switch (18; 19; 4A, 50). The inductor (81; 82; 72; 92) has a first end (811; 821; 721; 911) and a second end (812; 822; 722; 912). The switch (18; 19; 4A, 50) includes a first input-output terminal (181; 191; 44, 45, 46, 501), a second input-output terminal (182; 192; 49, 502), a first switching terminal (183; 193; 47, 503) coupled to the first end (811; 821; 721; 911) of the inductor (81; 82; 72; 91), and a second switching terminal (184; 194; 48, 504) coupled to the second end (812; 722; 912) of the inductor (81; 82; 72; 91). The switch (18; 19; 4A, 50) can switch between a first state and a second state. In the first state, the first input-output terminal (181; 191; 44, 45, 46, 501) is coupled to the first switching terminal (183; 193; 47, 503), and the second input-output terminal (182; 192; 49, 502) is coupled to the second switching terminal (184; 194; 48, 504). In the second state, the first input-output terminal (181; 191; 44, 45, 46, 501) is coupled to the second switching terminal (184; 194; 48, 504), and the second input-output terminal (182; 192; 49, 502) is coupled to the first switching terminal (183; 193; 47, 503).

With this aspect, desired characteristics can be achieved.

A radio-frequency circuit (1A) according to a second aspect further includes a power amplifier (5) with respect to the first aspect. The power amplifier (5) amplifies a transmit signal to be transferred to an antenna terminal (T1). The inductor is an inductor (72) coupled to the output side of the power amplifier (5).

The radio-frequency circuit (1) according to a third aspect further includes a low-noise amplifier (6) with respect to the first aspect. The low-noise amplifier (6) amplifies a receive signal transferred from the antenna terminal (T1). The inductor is the inductor (81; 82) coupled to the input side of the low-noise amplifier (6).

The radio-frequency circuit (1B) according to a fourth aspect further includes a low pass filter (9) with respect to the first aspect. The low pass filter (9) is electrically coupled to the antenna terminal (T1). The inductor is the inductor (91) included in the low pass filter (9).

The radio-frequency circuit (1; 1A; 1B) according to a fifth aspect further includes another inductor (131, 141, 151, 72, 91; 131, 141, 151, 81, 91; 72, 81) other than the inductor (81; 82; 72; 91) in any one of the first to fourth aspects.

With this aspect, it is possible to hinder the magnetic coupling between the inductor (81; 82; 72; 91) and the other inductor (131, 141, 151, 72, 91; 131, 141, 151, 81, 91; 72, 81), and as a result, desired characteristics can be achieved.

In the radio-frequency circuit (1; 1A; 1B) according to a sixth aspect, with respect to any one of the first to fifth aspects, the switch (18; 19; 50) is integrated with a switch (2) for switching signal paths for transmit signals in different communication bands, a switch (3) for switching signal paths for receive signals in different communication bands, or a switch (4) electrically coupled to the antenna terminal (T1).

With this aspect, the radio-frequency circuit (1; 1A; 1B) can be smaller than if the switch (2), the switch (3), or the switch (4) is provided separately from the switch (18; 19; 50).

The radio-frequency circuit (1; 1A) according to a seventh aspect further includes the power amplifier (5), the low-noise amplifier (6), and the other inductor (72; 81) with respect to any one of the first to sixth aspects. The power amplifier (5) amplifies a transmit signal to be transferred to an antenna terminal (T1). The low-noise amplifier (6) amplifies a receive signal transferred from the antenna terminal (T1). The other inductor (72; 81) is different from the inductor (81; 72). The inductor (81; 72) is one of the first inductor (72) coupled to the output side of the power amplifier (5) and the second inductor (81) coupled to the input side of the low-noise amplifier (6). The other inductor (72; 81) is the other of the first inductor (72) and the second inductor (81). With the radio-frequency circuit (1), a transmit signal and a receive signal are simultaneously transmitted and received by carrier aggregation or dual connectivity.

With this aspect, desired characteristics can be achieved also in communications by carrier aggregation or dual connectivity.

A communication device (100; 100A; 100B) according to an eighth aspect includes the radio-frequency circuit (1; 1A; 1B) according to any one of the first to seventh aspects and a signal processing circuit (16). The signal processing circuit (16) processes at least one of a receive signal transferred from the antenna terminal (T1) and a transmit signal to be transferred to the antenna terminal (T1).

With this aspect, desired characteristics can be achieved.

REFERENCE SIGNS LIST 1, 1A, 1B radio-frequency circuit
2 switch
3, 3A switch
4, 4A switch
5 power amplifier
6 low-noise amplifier
7 output matching circuit
8 input matching circuit
9 low pass filter
10, 11, 12 duplexer
13, 14, 15 matching circuit
16 signal processing circuit
17 antenna
18, 19 switch
20 common terminal
21, 22, 23 selection terminal
30 common terminal
31, 32, 33 selection terminal
40 common terminal
41, 42, 43 selection terminal
45, 46, 47, 48, 49 terminal
50 switch
51 input terminal
52 output terminal
61 input terminal
62 output terminal
71, 72 inductor
73, 74, 75 capacitor
81, 82 inductor
91 inductor
92 capacitor
100, 100A, 100B communication device
101, 111, 121 transmit filter
102, 112, 122 receive filter
131, 141, 151 inductor
161 RF signal processing circuit
162 baseband signal processing circuit
181, 182, 183, 184 terminal
191, 192, 193, 194 terminal
721, 811, 911 first end
722, 812, 912 second end
A1, A2, B1, B2, C1, C2 direction of current flow
T1 antenna terminal
T2 signal input terminal
T3 signal output terminal

The invention claimed is:

1. A radio-frequency circuit comprising:
an inductor having a first end and a second end; and
a switch having a first input-output terminal, a second input-output terminal, a first switching terminal coupled to the first end of the inductor, and a second switching terminal coupled to the second end of the inductor, the switch being configured to switch between a first state and a second state, wherein:
in the first state, the first input-output terminal is coupled to the first switching terminal, and the second input-output terminal is coupled to the second switching terminal, and
in the second state, the first input-output terminal is coupled to the second switching terminal, and the second input-output terminal is coupled to the first switching terminal.

2. The radio-frequency circuit according to claim 1, further comprising:
a power amplifier configured to amplify a transmit signal transferred to an antenna terminal,
wherein the inductor is coupled to an output side of the power amplifier via the switch.

3. The radio-frequency circuit according to claim 1, further comprising:
 a low-noise amplifier configured to amplify a receive signal transferred from an antenna terminal,
 wherein the inductor is coupled to an input side of the low-noise amplifier via the switch.

4. The radio-frequency circuit according to claim 1, further comprising:
 a low pass filter electrically coupled to an antenna terminal,
 wherein the low pass filter comprises the inductor.

5. The radio-frequency circuit according to claim 1, further comprising:
 a second inductor.

6. The radio-frequency circuit according to claim 1,
 wherein the switch is integrated with a second switch, a third switch, or a fourth switch,
 wherein the first switch is configured to switch signal paths for transmit signals in different communication bands, the second switch is configured to switch switching signal paths for receive signals in different communication bands, and the third switch is electrically coupled to an antenna terminal.

7. The radio-frequency circuit according to claim 1, further comprising:
 a power amplifier configured to amplify a transmit signal transferred to an antenna terminal;
 a low-noise amplifier configured to amplify a receive signal transferred from the antenna terminal; and
 a second inductor, wherein:
 the inductor is coupled to an output side of the power amplifier or coupled to an input side of the low-noise amplifier,
 the second inductor is coupled to the other of the output side of the power amplifier and the input side of the low-noise amplifier, and
 the radio-frequency circuit is configured to simultaneously transmit the transmit signal and receive the receive signal by carrier aggregation or dual connectivity.

8. A communication device comprising:
 the radio-frequency circuit according to claim 1; and
 a signal processing circuit configured to process a receive signal transferred from an antenna terminal or a transmit signal transferred to the antenna terminal.

\* \* \* \* \*